(12) United States Patent
Tsuda

(10) Patent No.: US 8,195,416 B2
(45) Date of Patent: Jun. 5, 2012

(54) FUNDAMENTAL WAVE BEAT COMPONENT DETECTING METHOD AND MEASURING TARGET SIGNAL SAMPLING APPARATUS AND WAVEFORM OBSERVATION SYSTEM USING THE SAME

(75) Inventor: Yukio Tsuda, Aiko-gun (JP)

(73) Assignee: Anritsu Corporation, Atsugi-Shi (JP)

( * ) Notice: Subject to any disclaimer, the term of this patent is extended or adjusted under 35 U.S.C. 154(b) by 235 days.

(21) Appl. No.: 12/308,263

(22) PCT Filed: Apr. 4, 2008

(86) PCT No.: PCT/JP2008/056809
§ 371 (c)(1),
(2), (4) Date: Apr. 22, 2010

(87) PCT Pub. No.: WO2009/122594
PCT Pub. Date: Oct. 8, 2009

(65) Prior Publication Data
US 2010/0299092 A1 Nov. 25, 2010

(51) Int. Cl.
*G01R 23/16* (2006.01)
*G01R 23/00* (2006.01)
*H04B 15/00* (2006.01)
*G10L 19/14* (2006.01)

(52) U.S. Cl. .......... 702/76; 702/75; 702/189; 704/205
(58) Field of Classification Search ........... 702/5, 76, 702/57, 66, 69, 71, 73, 74, 75, 78, 79, 189, 702/190, 199; 324/76.24, 76.19, 76.39, 76.23, 324/76.27, 76.33, 76.41, 76.42; 704/205, 704/236, 231
See application file for complete search history.

(56) References Cited

U.S. PATENT DOCUMENTS 6,529,843 B1 * 3/2003 Carpenter .......................... 702/75
6,677,577 B2 * 1/2004 Otani et al. ................. 250/227.14
(Continued)

FOREIGN PATENT DOCUMENTS

JP 2002-71725 A 3/2002
(Continued)

OTHER PUBLICATIONS

International Search Report dated Jun. 3, 2008 (in English) issued in counterpart International Application No. PCT/JP2008/056809.

(Continued)

*Primary Examiner* — Michael Nghiem
*Assistant Examiner* — Ricky Ngon
(74) *Attorney, Agent, or Firm* — Holtz, Holtz, Goodman & Chick., PC

(57) ABSTRACT

Frequencies of plural peak signals which appear in a band ½ of a sampling frequency are detected from a spectrum obtained from a measuring target signal sampled with the sampling frequency in order to detect the repetition frequency of the measuring target signal having plural harmonic components with a similar power. Each of the plural peak signals is successively assumed to be a fundamental wave beat component originating from the fundamental wave of the measuring target signal and theoretical frequencies of harmonic beat components originating from harmonic components of the measuring target signal are successively calculated. The theoretical frequencies are compared with the frequencies of the plural peak signals to determine one of the plural peak signals as a fundamental wave beat component originating from the fundamental wave of the measuring target signal.

12 Claims, 21 Drawing Sheets

U.S. PATENT DOCUMENTS 6,745,155 B1 * 6/2004 Andringa et al. ............. 702/189

FOREIGN PATENT DOCUMENTS

| JP | 2004-28960 A | 1/2004 |
|---|---|---|
| JP | 2006-3326 A | 1/2006 |
| JP | 2006-003327 A | 1/2006 |
| JP | 2006-47304 A | 2/2006 |
| JP | 2007-10411 A | 1/2007 |
| JP | 2008-51593 A | 3/2008 |

OTHER PUBLICATIONS

International Preliminary Report on Patentability (IPRP) dated Dec. 9, 2010 in International Application No. PCT/JP2008/056809.

* cited by examiner

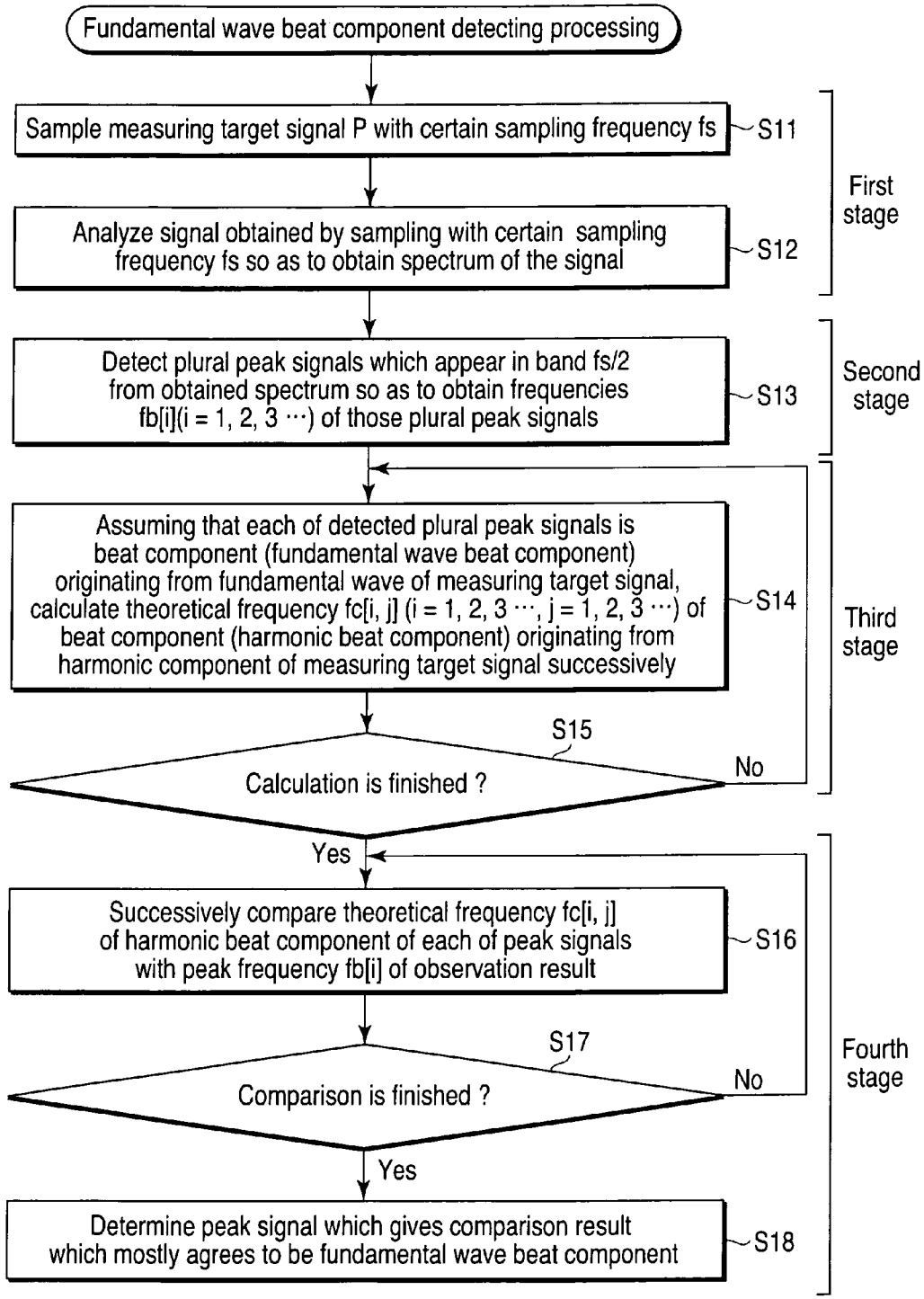
F I G. 1

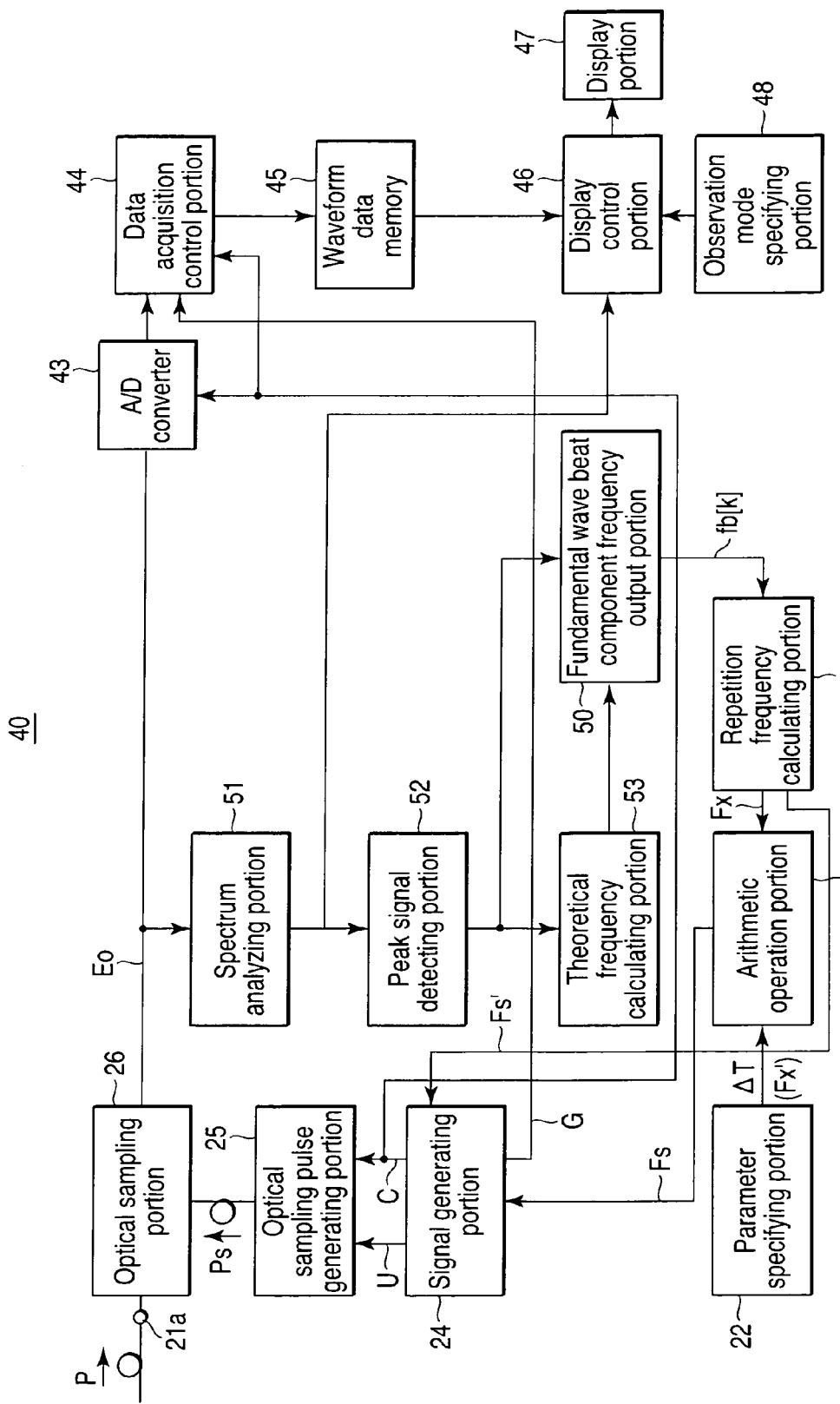
F I G. 9

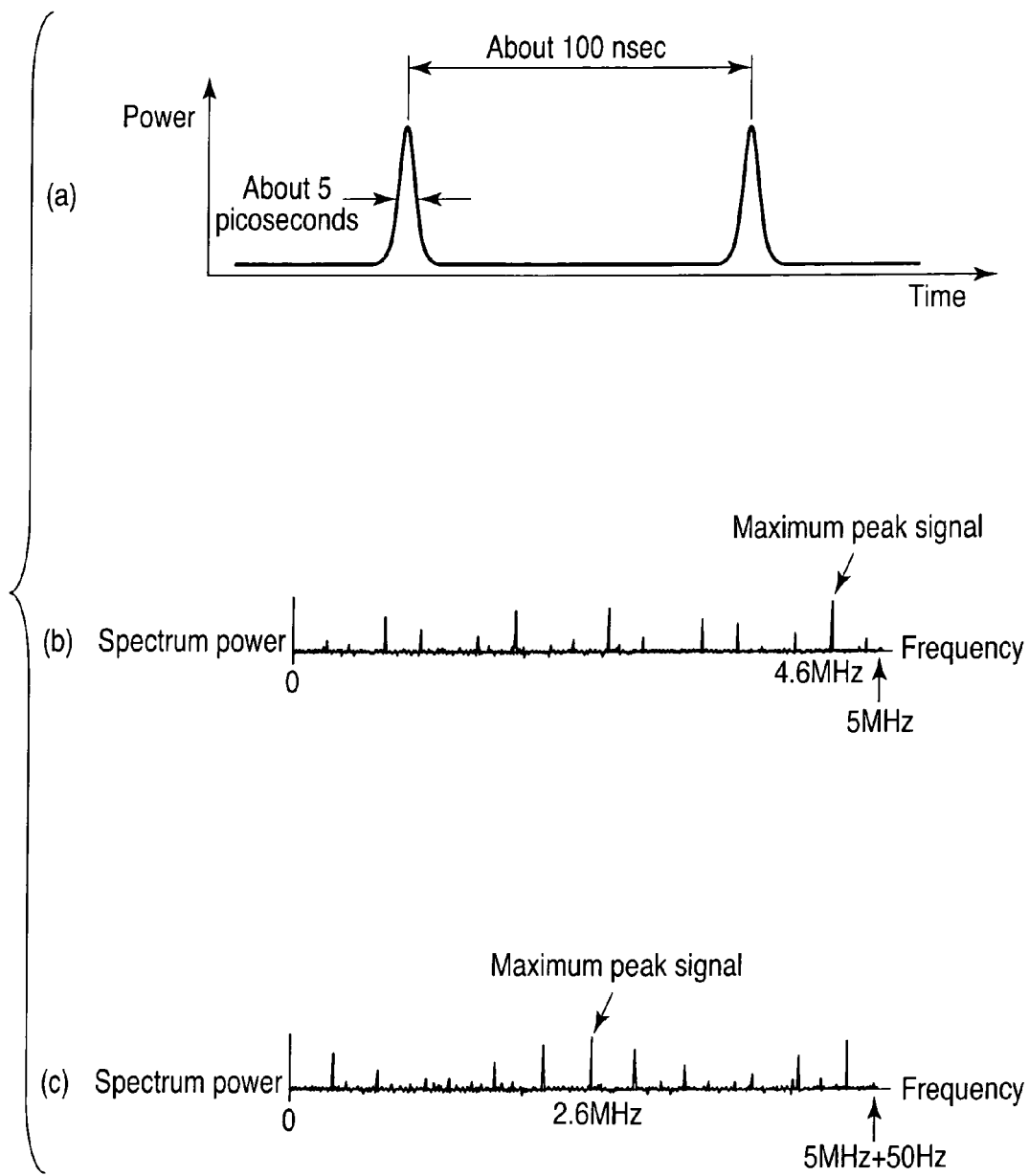
F I G. 25

FUNDAMENTAL WAVE BEAT COMPONENT DETECTING METHOD AND MEASURING TARGET SIGNAL SAMPLING APPARATUS AND WAVEFORM OBSERVATION SYSTEM USING THE SAME

This application is a U.S. National Phase Application under 35 USC 371 of International Application PCT/JP2008/056809 filed Apr. 4, 2008.

TECHNICAL FIELD

The present invention relates to a fundamental wave beat component detecting method, and a measuring target signal sampling apparatus and a waveform observation system using the same, and more particularly to a fundamental wave beat component detecting method in which even if a measuring target signal is a signal having a plurality of harmonic components having a similar power in a system which samples an optical signal modulated by fast repetition signals so as to acquire and observe its waveform information, the repetition frequency of the measuring target signal can be detected accurately to achieve stable waveform information acquisition and observation, a measuring target signal sampling apparatus and a waveform observation system using the same.

BACKGROUND ART

For example, a waveform observation apparatus 10 shown in FIG. 10 is used to acquire waveform data of an optical signal modulated by the fast repetition signal for observation.

This waveform observation apparatus 10 generates an optical sampling pulse Ps having a repetition cycle Ts (=N·Tx+ΔT) which is longer by a predetermined value (offset delay time) ΔT than N times (N is any integer of 1 or more, for example, 100 or 1000) the repetition cycle Tx of the waveform of a measuring target signal P and a short pulse width by means of optical sampling pulse generating means 11.

Then, the optical sampling pulse Ps generated by this optical sampling pulse generating means 11 is input to an optical sampling portion 12 together with the measuring target signal P.

A pulsed light obtained by sampling the measuring target signal P with the optical sampling pulse Ps is converted photoelectrically by the optical sampling portion 12 into an electric pulse signal Eo, which is output to an analog/digital (A/D) converter 13.

This A/D converter 13 converts the amplitude intensity of the electric pulse signal Eo to digital data and causes to store the data in a waveform data memory 14.

After a series of the waveform data stored in the waveform data memory 14 is read out by display control means 15, it is displayed as a waveform of the measuring target signal P on a display device 16.

In such a sampling type waveform observation apparatus 10, as shown in (a) of FIG. 11, the sampling timing by the optical sampling pulse Ps is shifted by a time ΔT as shown in (b) of FIG. 11 each time when the repetition waveform of the measuring target signal P is input continuously N times. Consequently, a series of waveform data obtained by sampling the waveform of the measuring target signal P under a high resolution can be observed on a screen of the display device 16 by a sampling much slower than the cycle Tx.

The waveform observation apparatus 10 of such a sampling type has been disclosed in, for example, patent document 1 mentioned below.

The observation mode required for the aforementioned waveform observation apparatus 10 includes persistence mode, averaging mode and the like.

The persistence mode is a mode which repeats an operation of sampling the measuring target signal P and displaying its acquired data on a screen of the display device for a specified time period to display a measured waveform with its incidental image, and enables changes of the waveform of the measuring target signal to be observed substantially in real time.

The averaging mode is a mode which executes averaging processing for the waveform data of plural data acquisition periods by sampling the measuring target signal P and displaying its averaged waveform, and enables waveform observation to be performed with noise component removed.

However, unless sampling at the time of sampling of the measuring target signal P is started from an identical phase position of the repetition waveform of the measuring target signal P, there occurs such an inconvenience that a displayed waveform may be shifted in a time axis each time in case of the observation mode which displays the waveform of the measuring target signal with the incidental image.

In the averaging mode, the averaging processing cannot be performed accurately and consequently, the waveform cannot be reproduced accurately, and further, the phase of the waveform and a magnitude of the fluctuation of the amplitude cannot be grasped accurately.

For this purpose, the repetition cycle of the measuring target signal or the frequency (bit rate) of the signal itself needs to be already known.

However, depending on a case, there occurs a following problem. Even if an approximate value of the repetition cycle of the waveform of a measuring target signal which is a target for observation or its frequency is known, no proper sampling cycle can be set for the waveform of a measuring target signal which is a target for observation if its accurate value is unknown, so that no desired waveform can be observed.

Further, this kind of the waveform observation apparatus has another problem that it needs an optical mixer for generating a narrow optical sampling pulse or mixing lights so that the entire apparatus including a display portion becomes complicated and expensive.

Accordingly, to solve these problems, the inventor of this application has proposed a repetition frequency detection method for the measuring target signal disclosed in patent document 2 described below as an earlier application in Japan.

Next, the repetition frequency detection method for the measuring target signal disclosed in the patent document 2 will be described.

The measuring target signal is assumed to be a sine wave of a single frequency Fx and the frequency component of a signal Sx obtained by sampling this with a temporary sampling frequency Fs' will be considered.

If the sampling pulse is an ideal pulse having an infinitely small width, its frequency component has respective spectrums (n=0, 1, 2, . . . ) of the frequency n·Fs' as shown in FIG. 12.

Thus, components of a difference and sum of the frequency Fx of the measuring target signal and each frequency n·Fs' are contained in the signal Sx obtained by sampling with this sampling pulse.

Of these, a component having the lowest frequency is a difference frequency of a spectrum component of the frequency n·Fs' most proximate to the frequency Fx or a difference frequency of a spectrum component of a frequency (n+1)·Fs' as shown in (a) and (b) of FIG. 13 and that difference frequency Fh' can be expressed as follows.

$$Fh'=\text{mod}[Fx, Fs'] \ldots \text{(case of mod}[Fx, Fs']\leq Fs'/2)$$

$$Fh'=(Fs'/2)-\text{mod}[Fx, Fs'] \ldots \text{(case of mod}[Fx, Fs]>Fs/2)$$

where a symbol mod[A, B] indicates a remainder when A is divided by B.

Because this difference frequency Fh' is Fs'/2 at maximum, it can be extracted simply using a low pass filter having a band upper limit of Fs'/2.

Here, a change δFh of the difference frequency Fh' accompanying a minute change δFs of the temporary sampling frequency Fs' is given in a following equation of differentiating the difference frequency Fh' with respect to the frequency Fs'.

$$\delta Fh/\delta Fs=-\text{quotient}[Fx, Fs'] \ldots \text{(case of } 0<\text{mod}[Fx, Fx']<Fs'/2)$$

$$\delta Fh/\delta Fs=1+\text{quotient}[Fx, Fs'] \ldots \text{(case of mod}[Fx, Fx']>Fs'/2)$$

where the symbol quotient [A, B] indicates an integer quotient when A is divided by B.

As a result of this, the frequency Fx of the measuring target signal can be obtained by the following equation according to a relation between the quotient and the remainder, mod[Fx, Fs']=Fx−Fx'·quotient [Fx, Fs'], $$Fx=Fh'-Fs'\cdot\delta Fh/\delta Fs \text{ (case of } 0>\delta Fh)$$

$$Fx=-Fh'+Fs'\cdot\delta Fh/\delta Fs \text{ (case of } 0<\delta Fh)$$

FIG. 14 is a flow chart showing an example of the procedure of the repetition frequency detecting method for the measuring target signal.

First, a measuring target signal is sampled with the temporary sampling frequency Fs' (step S1) and of signals obtained by that sampling, the frequency Fh' of a specific signal which appears in a band ½ of the temporary sampling frequency Fs' is detected (step S2).

Then, the temporary sampling frequency Fs' is changed by a minute amount ΔFs (for example, 1 Hz) (step S3) and the frequency change amount ΔFs of the specific signal is detected (step S4).

By substituting the temporary sampling frequency Fs', its frequency change amount ΔFs, the frequency Fh' of the specific signal and its frequency change amount ΔFh into the following equation (1), the repetition frequency Fx of the measuring target signal is calculated (step S5);

$$Fx=Fh'-Fs'\cdot\Delta Fh/\Delta Fs \text{ (case of } 0>\Delta Fh)$$

$$Fx=-Fh'+Fs'\cdot\Delta Fh/\Delta Fs \text{ (case of } 0<\Delta Fh) \quad (1)$$

In a system for acquiring and observing the waveform information, this frequency detecting processing is carried out on a measuring target signal and then, by setting a regular sampling frequency Fs corresponding to the obtained frequency Fx, acquisition and observation for the waveform information of the measuring target signal can be carried out accurately.

Further, the patent document 2 has disclosed a waveform observation system containing a sampling apparatus to which the repetition frequency detecting method for the measuring target signal is applied.

FIG. 15 shows the structure of the waveform observation system 20 containing the sampling apparatus to which the repetition frequency detecting method for the aforementioned measuring target signal is applied.

This waveform observation system 20 is constituted of a sampling apparatus 21 and a digital oscilloscope 60.

In the sampling apparatus 21, a measuring target signal P input through an input terminal 21a is sampled by an optical sampling portion 26 according to a sampling pulse which is a narrow optical pulse, generated from the sampling pulse generating portion 25 based on a clock signal C generated by the signal generating portion 24 so as to obtain a pulse signal Eo as its waveform information.

The digital oscilloscope 60 stores and displays the waveform information obtained by the sampling apparatus 21.

This sampling apparatus 21 has a manual setting mode which is specified when the repetition cycle of an observation target waveform is known accurately and an automatic setting mode which is specified when the repetition cycle of the observation target waveform is unknown or only its approximate value is known. The manual setting mode and automatic setting mode can be specified selectively by an operation of an operating portion, not shown.

In the meantime, a clock signal C and a trigger signal G generated by the signal generating portion 24 can be output through a clock output terminal 21b and a trigger output terminal 21d.

Likewise, it is so configured that the pulse signal Eo from the optical sampling portion 26 can be output outside through a sampling signal output terminal 21c.

The output terminals 21b to 21d of this sampling apparatus 21 are connected to an external clock input terminal 60a, first channel input terminal 60b and second channel input terminal 60c of the digital oscilloscope 60, respectively.

The digital oscilloscope 60 has an external clock synchronous function which executes A/D conversion processing for a signal input through the channels 60b, 60c synchronously with a clock signal input to the external clock input terminal 60a, an external trigger function which stores data obtained by the A/D conversion processing as waveform data for each channel until a specified time (depending on a display width of the time axis, the quantity of display points and the like) elapses since a timing at which the voltage of an input signal of an arbitrarily specified channel input terminal or trigger input terminal exceeds an arbitrarily set threshold in a predetermined direction, and a waveform display function which displays the stored waveform data on the time axis. As this waveform display mode, it is so configured that any one of the aforementioned persistence display mode and the averaging display mode can be displayed arbitrarily.

Next, an operation of the waveform observation system 20 will be described.

First, a measuring target signal P which is a substantially rectangular wave having a duty ratio of 50% is input to the input terminal 21a as shown in (a) of FIG. 16 and information corresponding to a substantial repetition cycle Tx' (frequency Fx') of the waveform and an offset delay time ΔT of the sampling is specified by a parameter specifying portion 22 and then, the automatic setting mode is specified by an operating portion, not shown.

The arithmetic operation portion 23 calculates the temporary sampling frequency Fs' and trigger frequency Fg' based on the specified substantial repetition frequency Fx' and offset delay time ΔT and sets them in the signal generating portion 24.

In the meantime, if the automatic setting mode is specified with the repetition cycle Tx' (frequency Fx') not specified, the arithmetic operation portion 23 executes arithmetic operation according to a specified value, for example, with 10 GHz set as the repetition frequency Fx'.

Thus, the clock signal C of the temporary frequency Fs' is output from the signal generating portion 24.

The optical sampling portion 26 executes sampling for the measuring target signal P according to the temporary sampling frequency Fs' and a pulse signal Eo obtained by the sampling is input to a specific signal frequency detecting portion 27.

Of the frequency components contained in the pulse signal Eo obtained by that sampling, the specific signal frequency detecting portion 27 regards a frequency component having the highest level which appears in a band ½ of the temporary sampling frequency Fs' as a specific signal and detects its frequency Fh'.

As regards the waveform of this optical signal, the spectrum of the optical sampling pulse Ps for use in sampling appears every frequency Fs' as shown in FIG. 17 and the spectrum of the waveform of the measuring target signal P appears every frequency Fx while the level is decreased as its order is increased.

Accordingly, the specific signal frequency detecting portion 27 obtains a difference frequency Fh' between the frequency Fx at the lowest order and a temporary sampling frequency component n·Fs' most proximate to that frequency Fx as the frequency of the specific signal and outputs it to a repetition frequency calculating portion 28.

When the frequency Fh' of the specific signal concerning the temporary sampling frequency Fs' is obtained, the repetition frequency calculating portion 28 stores this frequency Fh' and instructs the signal generating portion 24 to change the temporary sampling frequency Fs' by a minute amount (for example, 1 Hz).

The temporary sampling frequency Fs' to the measuring target signal P is changed by only the minute amount $\Delta$Fs by the signal generating portion 24 which receives this instruction and accompanied by this change, the frequency of the specific signal detected by the specific signal frequency detecting portion 27 is changed by only $\Delta$Fh. The repetition frequency Fx of the waveform of the optical signal is calculated by this change amount according to the following equation and set in the arithmetic operation portion 23.

$$Fx = Fh' - Fs' \cdot \Delta Fh / \Delta Fs$$

The arithmetic operation 23 calculates a regular sampling frequency Fs and trigger frequency Fg corresponding to the input signal accurately based on the accurate repetition frequency Fx calculated by the repetition frequency calculating portion 28 and sets them in the signal generating portion 24.

As a result, a clock signal C having the same cycle as N·Tx+$\Delta$T and optical sampling pulse Ps are generated with respect to the repetition cycle Tx having the waveform of the measuring target signal P as shown in (b) and (c) of FIG. 16.

Then, the measuring target signal P is sampled by the optical sampling pulse Ps and a pulse signal Eo obtained by that sampling is input to the first channel input terminal 60b of the digital oscilloscope 60 from the optical sampling portion 26 through the sampling signal output terminal 21c as shown in (d) of FIG. 16.

A trigger signal G having the same cycle as that of the waveform of an envelope curve which connects the peaks of the pulse signal Eo as shown in (b) of FIG. 18 is generated from the signal generating portion 24 and input to the second channel input terminal 60c of the digital oscilloscope 60 through the trigger output terminal 21D.

Furthermore, (a) of FIG. 18 shows the waveform shown in (d) of FIG. 16 such that its time axis is contracted.

The digital oscilloscope 60 executes the A/D conversion processing for the pulse signal Eo synchronously with the clock signal C, outputs data of the envelope curve which connects the peak points of the pulse signal Eo successively in the form of the optical signal waveform data and starts acquisition of the waveform data at a timing when the trigger signal G exceeds a trigger level in a predetermined direction.

As a result, a waveform of the optical signal P is displayed with points at an interval $\Delta$T in terms of offset delay time on the screen of the digital oscilloscope 60 as shown in, for example, FIG. 19 in the form of an incidental image.

The digital oscilloscope 60 starts acquisition of the waveform data at each timing when the trigger signal G exceeds a trigger level in a predetermined direction and displays the waveform by updating. Because the sampling frequency and trigger frequency of the sampling apparatus 20 correspond to the repetition frequency of the waveform of the optical signal P to be input accurately, the position of the waveform always displayed is never deflected, thereby stable waveform observation being achieved.

Patent document 1: Jpn. Pat. Appln. KOKAI Publication No. 2002-071725

Patent document 2: Jpn. Pat. Appln. KOKAI Publication No. 2006-3327

DISCLOSURE OF INVENTION

That is, according to the repetition frequency detecting method for the measuring target signal disclosed in the patent document 2, if speaking in summary, of signals obtained in case of sampling a measuring target signal under a certain repetition frequency fs, the frequency fh of a specific signal which appears in a band fs/2 is measured and a frequency change amount dfh of the specific signal obtained in case of sampling the sampling frequency only by a minute frequency dfs is measured so as to obtain a repetition frequency fx of the measuring target signal according to the following equations.

$$fx = fh - fs \cdot dfh/dfs \text{ (case of } 0 > dfh/dfs\text{)}$$

$$fx = -fh + fs \cdot dfh/dfs \text{ (case of } 0 < dfh/dfs\text{)}$$

Here, a specific measurement of the frequency change amount dfh of the specific signal is carried out, for example, as follows.

First, a measuring target signal having a waveform as shown in (a) of FIG. 24 is sampled under a certain repetition frequency fs and the obtained signal is treated according to a method such as Fourier transformation so as to obtain a spectrum as shown in (b) of FIG. 24.

Next, a frequency component having a maximum peak power in a band fs/2 is determined as the specific signal and detected so as to obtain its frequency fh.

Next, the measuring target signal is sampled by changing the sampling frequency only by a minute frequency dfs so as to obtain a spectrum as shown in (c) of FIG. 24 using the same method as described above.

Next, in the same way as described above, the frequency component having a maximum peak power in the band ½ of the sampling frequency is determined as the specific signal and detected, and the frequency fh of the specific signal before the sampling frequency is changed is subtracted from that frequency, so as to obtain the frequency change amount dfh of the specific signal with respect to the sampling frequency change.

However, the repetition frequency detecting method for the measuring target signal disclosed in the patent document 2 still has the following problem to be solved.

That is, if the measuring target signal is a signal having plural harmonic components having a similar power, there might occur a serious error in a measurement result of detection for the repetition frequency of the measuring target signal.

The case where the measuring target signal is a signal "having the plural harmonic components having a similar power" includes the following cases.

(1) Case Where the Pulse Width is Smaller With Respect to the Pulse Cycle

For example, this includes a case where the pulse width w is smaller with respect to a pulse cycle 1/fx as shown in (a) of FIG. 20 and in its spectrum, plural harmonic components of pulse repetition frequency fx (or bit rate), 2fx, 3fx, 4fx, . . . exist as shown in (b) of FIG. 20.

In this case, as the pulse width is smaller with respect to the pulse cycle, power of the harmonic component is decreased only gradually, so that a number of the harmonic components exist.

(2) Case Due to the Pattern of Data Modulation

This is a case of a modulated signal having a 5-bit pattern length of data 01011 while its pulse repetition frequency (or bit rate) is fx, as shown in (a) of FIG. 21. A number of harmonic components 2fx/5, 3fx/5, 4fx/5, of the frequency fx/5 obtained by dividing the pulse repetition frequency (or bit rate) fx by a pattern length (bit length), exist in that spectrum as shown in (b) of FIG. 21.

In this case, each spectrum power is changed largely by a duty or waveform indicating by what percentage the signal status is maintained per time slot.

(3) Case of Time-Division Multiplexing, in Which the Time Slot Position is Shifted Depending on Each Channel As shown in (a) of FIG. 22, when four channels each having a bit rate fx/4 are turned into a single signal by optical·time-division multiplexing (O-TDM), usually the harmonic component of fx/4 is decreased due to suppression if the time slot positions of each channel are disposed with an identical interval, so that the fx (and its harmonic component) becomes predominant. However, if the time slot positions of each channel are not disposed at the identical interval as shown in FIG. 22B, the harmonic components 2fx/4, 3fx/4, 4fx/4, . . . having a bit rate fx/4 of each channel are increased without being suppressed as shown in (c) of FIG. 22.

(4) Case Where the Aforementioned (1), (2), (3) are Combined

Next, there will be described the reason why a large error occurs in a measurement result of the detected repetition frequencies of the measuring target signals if the measuring target signal is a signal having plural harmonic components having a similar power like in the above-described (1), (2), (3).

Because the spectrum relation between the measuring target signal and the sampling signal is a relation as shown in (a) of FIG. 23, plural beat frequency components constituted of plural frequency components (fx/3, 2fx/3, fx . . . ) of the measuring target signal and the harmonic component of the sampling frequency most proximate to those appear in signals obtained by sampling the measuring target signal, as shown in FIG. 23B.

However, the spectrum powers of those plural beat frequency components resemble each other in the cases of (1), (2), (3) and (4) described above. Thus, sometimes, which is a spectrum component to which attention should be paid cannot be determined by comparing the peak powers.

As a specific example in such a case, a case of applying the repetition frequency detecting method for the measuring target signal disclosed in the patent document 2 to a measuring target signal shown in (a) of FIG. 25 having a repetition frequency of about 10 GHz and a pulse width of about 5 picoseconds will be described in detail below.

If this measuring target signal is sampled with, for example, a sampling frequency 10 MHz and its obtained signal is subjected to Fourier transformation or the like, a spectrum of plural peak signals having a similar peak power is obtained as shown in (b) of FIG. 25.

From those plural peak signals, a peak signal indicated with an arrow in the same Figure having the largest peak power is detected as a specific signal and its frequency of fh=4.6 MHz is obtained.

Next, the sampling frequency is changed only by a minute frequency, for example, dfs=100 Hz so as to sample the measuring target signal and consequently, a spectrum as shown in (c) of FIG. 25 is obtained in the same method as the above-described one.

Next, from the spectrum shown in (c) of FIG. 25, a peak signal indicated with an arrow in the same Figure having the largest peak power is detected as the specific signal in the same way as described above so as to obtain its frequency of 2.6 MHz.

Therefore, a change amount dfh of the specific signal frequency with respect to a change amount dfs of the sampling frequency is calculated as 2.6 MHz–4.6 MHz=–2 MHz.

Consequently, the repetition frequency of the measuring target signal is calculated as fx=fh–fs·dfh/dfs=4.6 MHz–10 MHz·(–2 MHz)/100 Hz=200.005 GHz. However, this calculation result is clearly mistaken because it is 200.005 GHz with respect to a measuring target signal having a repetition frequency of about 10 GHz.

This is because before and after the sampling frequency is changed, the beat frequency component originating from a harmonic component having a different order of the measuring target signal is determined to be a specific signal.

That is, in this example, although the beat frequency component (harmonic beat component) originating from a second order harmonic component (about 20 GHz) of the measuring target signal is determined to be the specific signal and detected first, after the sampling frequency is changed by 100 Hz, the beat frequency component (harmonic beat component) originating from the fundamental wave (about 10 GHz) of the measuring target signal is determined to be the specific signal and detected.

In the repetition frequency detecting method for the measuring target signal disclosed in the patent document 2, when the frequency of the beat signal is measured before and after the sampling frequency is changed, a measurement result may turn to a completely unreasonable value if attention is paid to a different beat component before and after the sampling frequency is changed.

Accordingly, in the repetition frequency detecting method for the measuring target signal, the sampling apparatus and waveform observation system using the method disclosed in the patent document 2, the repetition frequency of the measuring target signal cannot be detected accurately from a sampling result if the measuring target signal has plural harmonic components having a similar power. Therefore, no stable acquisition or observation of the waveform information can be carried out and further, the entire system cannot be constructed easily.

An object of the present invention is to solve these problems and provide a fundamental beat component detecting method for determining which peak signal is a beat component originating from the fundamental wave component of the measuring target signal among the plural peak signals contained in the sampling result even if the measuring target signal is a signal having plural harmonic components having a similar power, and a sampling apparatus and a waveform observation system which can execute stable acquisition and observation of the waveform information about the measuring target signal by detecting the repetition frequency of the measuring target signal accurately using the method and construct the entire system easily.

In order to achieve the above-described object, according to a first aspect of the present invention, there is provided a fundamental wave beat component detecting method comprising:

a first stage (S11, S12) of analyzing a signal obtained by sampling a measuring target signal (P) with a sampling frequency (fs) so as to obtain a spectrum thereof;

a second stage (S13) of detecting plural peak signals which appear in a band ½ of the sampling frequency fs from the spectrum obtained in the first stage (S11, S12) so as to obtain the frequencies fb[i] (i=1, 2, 3 . . . ) of the plural peak signals;

a third stage (S14, S15) of assuming that each of the plural peak signals detected in the second stage (S13) is a beat component (fundamental wave beat component) originating from the fundamental wave of the measuring target signal P so as to calculate each theoretical frequency fc[i,j] (i=1, 2, 3 . . . , j=1, 2, 3 . . . ), successively, of a beat component (harmonic beat component) originating from the harmonic component of the measuring target signal P; and a fourth stage (S16, S17, S18) of comparing each theoretical frequency fc[i,j] of the harmonic beat component calculated successively for each peak signal in the third stage (S14, S15) with the frequencies fb[i] of the plural peak signals detected in the second stage (S13) so as to determine that the peak signal which gives theoretical frequencies fc[k,j] (k is an integer) of the harmonic beat component which mostly agrees with the frequency fb[i] of the plural peak signals is the fundamental wave beat component, based on a result of the comparison.

In order to achieve the above-described object, according to a second aspect of the present invention, there is provided the fundamental wave beat component detecting method according to the first aspect, wherein the third stage (S14, S15) includes calculating the theoretical frequency fc[i,j] of the harmonic beat component originating from a j-order harmonic component of the measuring target signal P in the case where the fb[i] is assumed to be the frequency of the fundamental wave beat component, according to fc[i,j]=mod(j·fb[i],fs) in case of mod(j·fb[i],fs)<fs/2, fc[i,j]=fs−mod(j·fb[i], fs) in case of mod(j·fb[i], fs)≧fs/2.

In order to achieve the above-described object, according to a third aspect of the present invention, there is provided the fundamental wave beat component detecting method according to the second aspect, wherein the fourth stage (S16, S17, S18) includes:

a fifth stage (S19, S20) of calculating a sum of absolute values of differences in terms of the frequency between each theoretical frequency fc[i,j] of the harmonic beat components and the plural peak signals most proximate to the theoretical frequencies fc[i,j] successively; and a sixth stage (S21) of determining that the peak signal which gives the theoretical frequencies fc[k,j] (k is an integer) of the harmonic beat component which minimizes the sum of the absolute values calculated successively for each peak signal in the fifth stage (S19, S20) is the fundamental wave beat component originating from the fundamental wave of the measuring target signal (P).

In order to achieve the above-described object, according to a fourth aspect of the present invention, there is provided the fundamental wave beat component detecting method according to the second aspect, wherein the fourth stage (S16, S17, S18) includes:

a seventh stage (S22, S23) of calculating absolute values of differences in terms of the frequency between each theoretical frequency fc[i,j] of the harmonic beat component and the plural peak signals most proximate to the theoretical frequencies fc[i,j] successively;

an eighth stage (S24, S25) of taking out specified number of the absolute values in an ascending order in a value successively from the absolute values calculated successively for each peak signal in the seventh stage (S22, S23), and calculating a sum of those, successively; and a ninth stage (S26) of determining that the peak signal which gives the theoretical frequencies fc[k,j] (k is an integer) of the harmonic beat component which minimizes the sum of the absolute values of the specified number calculated successively for each peak signal in the eighth stage (S24, S25) is the fundamental beat component originating from the fundamental wave of the measuring target signal (P).

In order to achieve the above-described object, according to a fifth aspect of the present invention, there is provided a sampling apparatus for a measuring target signal, comprising:

an input terminal (21a) to input a measuring target signal (P);

a signal generating portion (24) which generates a clock signal (C) of a specified sampling frequency;

a sampling pulse generating portion (25) which generates a sampling pulse synchronous with the clock signal (C);

a sampling portion (26) which samples the measuring target signal (P) input to the input terminal (21a) with the sampling pulse;

a spectrum analyzing portion (51) which receives an output signal from the sampling portion (26) and outputs a spectrum of the output signal;

a peak signal detecting portion (52) which detects plural peak signals which appear in a band ½ of the specified sampling frequency from the spectrum output from the spectrum analyzing portion (51) so as to obtain the frequency Fb[i] (i=1, 2, 3 . . . ) of the plural peak signals;

a theoretical frequency calculating portion (53) which assumes that each of the plural peak signals detected by the peak signal detecting portion (52) is a beat component (fundamental wave beat component) originating from the fundamental wave of the measuring target signal (P) so as to calculate each theoretical frequency Fc[i,j] (i=1, 2, 3, . . . , j=1, 2, 3 . . . ) of a beat component (harmonic beat component) originating from the harmonic component of the measuring target signal (P);

a fundamental wave beat component frequency output portion (50) which compares each theoretical frequencies Fc[i,j] of the harmonic beat component calculated successively for each peak signal by the theoretical frequencies calculating portion (53) with the frequencies Fb[i] of the plural peak signals obtained by the peak signal detecting portion (52), determines that the peak signal which gives the theoretical frequencies Fc[k,j] (k is an integer) of the harmonic beat component which mostly agrees with those frequencies Fb[i] is the fundamental beat component originating from the fundamental wave of the measuring target signal (P) based on a result of the comparison, and outputs the frequency Fb[k] of the peak signal as a specific signal frequency (Fh');

a repetition frequency calculating portion (28) which specifies a temporary sampling frequency (Fs') to the signal generating portion (24), changes the temporary sampling frequency (Fs') by a predetermined amount (ΔFs) so as to obtain a change amount (ΔFh) of the specific signal frequency with respect to the change amount of the sampling frequency and calculates the repetition frequency (Fx) of the waveform of the measuring target signal (P) based on the temporary sampling frequency, the specific signal frequency to the temporary sampling frequency, the change amount of the sampling frequency and the change amount of the specific signal frequency;

an arithmetic operation portion (23) which calculates a frequency corresponding to a cycle (Ts) having a difference of a predetermined offset delay time (ΔT) with respect to an integer time the repetition cycle (Tx) corresponding to the repetition frequency of the waveform of the measuring target signal (P) calculated by the repetition frequency calculating portion (28) as a regular sampling frequency (Fs) to the measuring target signal (P) and specifies the regular sampling frequency to the signal generating portion (24);

a clock output terminal (21b) to output the clock signal (C) from the signal generating portion (24) outward; and a sampling signal output terminal (21c) to output a signal output from the sampling portion (26) outward.

In order to achieve the above-described object, according to a sixth aspect of the present invention, there is provided the sampling apparatus for the measuring target signal according to the fifth aspect, wherein assuming that the Fb[i] is the frequency of the fundamental wave beat component, the theoretical frequency calculating portion (53) calculates the theoretical frequency Fc[i,j] of the harmonic beat component originating from a j-order harmonic component of the measuring target signal (P) according to following equations, $Fc[i,j] = \mod(j \cdot Fb[i], Fs')$,
  in case of $\mod(j \cdot Fb[i], Fs') < Fs'/2$ $Fc[i,j] = Fs' - \mod(j \cdot Fb[i], Fs')$,
  in case of $\mod(j \cdot Fb[i], Fs') \geq Fs'/2$.

In order to achieve the above-described object, according to a seventh aspect of the present invention, there is provided the sampling apparatus for the measuring target signal according to the sixth aspect, wherein the fundamental wave beat component frequency output portion (50) calculates a sum of absolute values of differences in terms of the frequency between each theoretical frequencies Fc[i,j] of the harmonic beat component and the plural peak signals most proximate to those successively, and determines that the peak signal which gives the theoretical frequencies Fc[k,j] (k is an integer) of the harmonic beat component which minimizes the sum of the absolute values calculated successively for each peak signal is the fundamental wave beat component originating from the fundamental wave of the measuring target signal (P) and outputs the frequency Fb[k] of the peak signal as the specific signal frequency (Fh').

In order to achieve the above-described object, according to an eighth aspect of the present invention, there is provided the sampling apparatus for the measuring target signal according to the sixth aspect, wherein the fundamental wave beat component frequency output portion (50) calculates absolute values of differences in terms of the frequency between each theoretical frequency Fc[i,j] of the harmonic beat component and the plural peak signals most proximate to those, takes out a specified number from the absolute values calculated successively for each peak signal in an ascending order in a value so as to calculate a sum of those successively, and determines that the peak signal which gives the theoretical frequencies Fc[k,j] (k is an integer) of the harmonic beat component which minimizes the sum of the absolute values of the specified number successively calculated for each peak signal is the fundamental wave beat component originating from the fundamental wave of the measuring target signal (P) so as to output the frequency Fb[k] of the peak signal as the specific signal frequency (Fh').

In order to achieve the above-described object, according to a ninth aspect of the present invention, there is provided a waveform observation system comprising:

an input terminal (21a) to input a measuring target signal (P);

a signal generating portion (24) which generates a clock signal (C) of a specified sampling frequency (fs);

a sampling pulse generating portion (25) which generates a sampling pulse synchronous with the clock signal;

a sampling portion (26) which samples the measuring target signal (P) input to the input terminal (21a) with the sampling pulse (Ps);

a spectrum analyzing portion (51) which receives an output signal from the sampling portion (26) and outputs a spectrum of the output signal;

a peak signal detecting portion (52) which detects plural peak signals which appear in a band ½ of the specified sampling frequency from the spectrum output from the spectrum analyzing portion (51) so as to obtain the frequency Fb[i] (i=1, 2, 3 . . . ) of the plural peak signals;

a theoretical frequency calculating portion (53) which assumes that each of the plural peak signals detected by the peak signal detecting portion (52) is a beat component (fundamental wave beat component) originating from the fundamental wave of the measuring target signal (P) so as to calculate successively each theoretical frequencies Fc[i,j] (i=1, 2, 3, . . . , j=1, 2, 3 . . . ) of a beat component (harmonic beat component) originating from the harmonic component of the measuring target signal (P);

a fundamental wave beat component frequency output portion (50) which compares each theoretical frequencies Fc[i,j] of the harmonic beat component calculated successively for each peak signal by the theoretical frequencies calculating portion (53) with the frequency Fb[i] of the plural peak signals obtained by the peak signal detecting portion (52), determines that the peak signal which gives the theoretical frequency Fc[k,j] (k is an integer) of the harmonic beat component which mostly agrees with those frequencies Fb[i] is the fundamental beat component originating from the fundamental wave of the measuring target signal (P) based on a result of the comparison, and outputs the frequency Fb[k] of the peak signal as a specific signal frequency (Fh');

a repetition frequency calculating portion (28) which specifies a temporary sampling frequency (Fs') to the signal generating portion (24), changes the temporary sampling frequency by a predetermined amount (ΔFs) so as to obtain a change amount (ΔFh) of the specific signal frequency with respect to the change amount of the sampling frequency and calculates the repetition frequency (Fx) of the waveform of the measuring target signal (P) based on the temporary sampling frequency, the specific signal frequency to the temporary sampling frequency, the change amount of the sampling frequency and the change amount of the specific signal frequency;

an arithmetic operation portion (23) which calculates a frequency corresponding to a cycle (Ts) having a difference of a predetermined offset delay time (ΔT) with respect to an integral multiple of the repetition cycle (Tx) corresponding to the repetition frequency of the waveform of the measuring target signal (P) calculated by the repetition frequency calculating portion (28) as a regular sampling frequency (Fs) to the measuring target signal (P) and specifies the regular sampling frequency to the signal generating portion (24);

an analog/digital (A/D) converter (43) which converts a signal output from the sampling portion (26) by being sampled with the regular sampling pulse to digital waveform data and outputs it;

a waveform data memory (45) to memorize the digital waveform data output from the A/D converter (43);

a data acquisition control portion (44) which writes the digital waveform data output from the A/D converter (43) into the waveform data memory (45) synchronously with the clock signal from the signal generating portion (24); and a display control portion (46) which reads out a series of the waveform data stored in the waveform data memory (45) and cause to display it on the time axis of the display portion (46) at an interval corresponding to the predetermined offset delay time ($\Delta T$).

In order to achieve the above-described object, according to a tenth aspect of the present invention, there is provided the waveform observation system according to the ninth aspect, wherein assuming that the Fb[i] is the frequency of the fundamental wave beat component, the theoretical frequency calculating portion (53) calculates the theoretical frequencies Fc[i,j] of the harmonic beat component originating from a j-order harmonic component of the measuring target signal P according to following equations, $Fc[i,j] = \mod(j \cdot Fb[i], Fs')$,
in case of $\mod(j \cdot Fb[i], Fs') < Fs'/2$ $Fc[i,j] = Fs' - \mod(j \cdot Fb[i], Fs')$,
in case of $\mod(j \cdot Fb[i], Fs') \geq Fs'/2$.

In order to achieve the above-described object, according to an eleventh aspect of the present invention, there is provided the waveform observation system according to the tenth aspect, wherein the fundamental wave beat component frequency output portion (50) calculates a sum of absolute values of differences in terms of the frequency between each theoretical frequencies Fc[i,j] of the harmonic beat component and the plural peak signals most proximate to the theoretical frequency Fc[i,j] successively, and determines that the peak signal which gives the theoretical frequencies Fc[k,j] (k is an integer) of the harmonic beat component which minimizes the sum of the absolute values calculated successively for each peak signal is the fundamental wave beat component originating from the fundamental wave of the measuring target signal (P) and outputs the frequency Fb[k] of the peak signal as the specific signal frequency (Fh').

In order to achieve the above-described object, according to a twelfth aspect of the present invention, there is provided the waveform observation system according to the tenth aspect, wherein the fundamental wave beat component frequency output portion (50) calculates absolute values of differences in terms of the frequency between each theoretical frequencies Fc[i,j] of the harmonic beat component and the plural peak signals most proximate to the theoretical frequencies FC[i,j], takes out a specified number from the absolute values calculated successively for each peak signal in an ascending order in a value so as to calculate a sum of those successively, and determines that the peak signal which gives the theoretical frequencies Fc[k,j] (k is an integer) of the harmonic beat component which minimizes the sum of the absolute values of the specified number successively calculated for each peak signal is the fundamental wave beat component originating from the fundamental wave of the measuring target signal (P) so as to output the frequency Fb[k] of the peak signal as the specific signal frequency (Fh').

According to the fundamental wave beat component detecting method of the present invention, as described above, plural peak signals which appear in a band ½ of the sampling frequency fs are detected from a spectrum obtained by analyzing a signal obtained by sampling the measuring target signal P with a certain frequency fs so as to obtain the frequencies fb[i] (i=1, 2, 3 . . . ) of those plural peak signals, and then, each theoretical frequencies fc[i,j] (i=1, 2, 3 . . . , j=1, 2, 3 . . . ) of the beat component (harmonic beat component) originating from the harmonic component of the measuring target signal P is calculated successively when assuming that each of those plural peak signals is a beat component (fundamental wave beat component) originating from the fundamental wave of the measuring target signal P, and each theoretical frequencies fc[i,j] of these harmonic beat components is successively compared with the frequencies fb[i] of the plural peak signals and based on a result of the comparison of the peak signals in succession, the peak signal which gives the theoretical frequencies fc[k,j] (k is an integer) of the harmonic beat component which agrees with those frequencies fb[i] most is determined to be the fundamental wave beat component. Consequently, even if the measuring target signal P is a signal having plural harmonic components having a similar power, the fundamental wave beat component can be detected at a high accuracy without any error.

Further, according to the sampling apparatus and waveform observation system for the measuring target signal of the present invention, by measuring the repetition frequency of the measuring target signal P using the fundamental wave beat component detecting method, the measuring target signal P can be sampled at a high accuracy even if the measuring target signal P is a signal having plural harmonic components having a similar power and the waveform of the measuring target signal can be observed at a high accuracy.

BRIEF DESCRIPTION OF DRAWINGS

FIG. 1 is a flow chart for explaining the procedure of the fundamental wave beat component detecting method according to a first embodiment of the present invention.

FIG. 9 is a block diagram for explaining the configuration of the waveform observation system containing the sampling apparatus for the measuring target signal according to a third embodiment of the present invention.

FIG. 25 is a waveform diagram for explaining a different example of the case where the measuring target signal is a signal having plural harmonic components having a similar power.

BEST MODE FOR CARRYING OUT THE INVENTION

Figure 2:
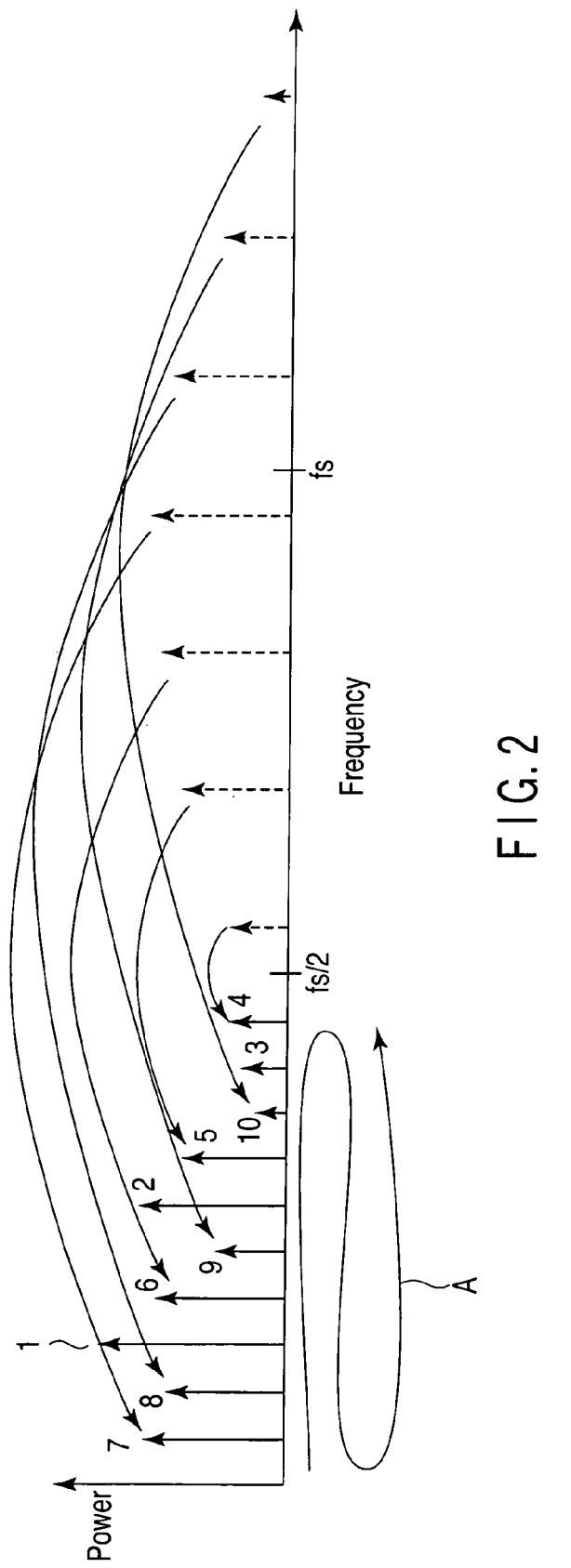
FIG. 2 is a diagram for explaining the principle of the fundamental wave beat component detecting method according to the first embodiment of the present invention.

Hereinafter, embodiments of the present invention will be described with reference to the accompanying drawings.

(First Embodiment)

FIG. 1 is a flow chart for explaining the procedure of the fundamental wave beat component detecting method according to the first embodiment of the present invention.

A fundamental wave beat component detecting method according to the present invention basically includes: a first stage of analyzing a signal obtained by sampling a measuring target signal P with a sampling frequency fs so as to obtain a spectrum thereof; a second stage of detecting plural peak signals which appear in a band ½ of the sampling frequency fs from the spectrum obtained in the first stage so as to obtain the frequencies fb[i] (i=1, 2, 3 . . . ) of the plural peak signals; a third stage of assuming that each of the plural peak signals detected in the second stage is a beat component (fundamental wave beat component) originating from the fundamental wave of the measuring target signal P so as to calculate each theoretical frequency fc[i,j] (i=1, 2, 3 . . . , j=1, 2, 3 . . . ), successively, of a beat component (harmonic beat component) originating from the harmonic component of the measuring target signal P; and a fourth stage of comparing each theoretical frequency fc[i,j] of the harmonic beat component calculated successively for each peak signal in the third stage with the frequencies fb[i] of the plural peak signals detected in the second stage so as to determine that the peak signal which gives a theoretical frequencies fc[k,j] (k is an integer) of the harmonic beat component which mostly agrees with the frequency fb[i] of the plural peak signals is the fundamental wave beat component, based on a result of the comparison.

More specifically, as shown in FIG. 1, the measuring target signal P is sampled with a sampling signal Ps having a sampling frequency fs (step S11).

Next, a signal obtained by sampling in step S11 is analyzed so as to obtain its spectrum, so that of the obtained spectrum, a plurality of peak signals which appear in a band ½ of the aforementioned sampling frequency fs are detected so as to obtain the frequencies fb[i] (i=1, 2, 3, . . . ) of the plural peak signals (steps S12, S13).

Next, assuming that each of the plural peak signals detected in steps S12, S13 is a beat component (harmonic beat component) originating from the fundamental wave of the measuring target signal P, each theoretical frequency fc[i,j] (i=1, 2, 3, . . . j=1, 2, 3 . . . ) of the beat component (harmonic beat component) originating from the harmonic component of the measuring target signal P is calculated successively (steps S14, S15).

Next, the theoretical frequency fc[i,j] of the harmonic beat component calculated successively for each peak signal in steps S14, S15 is compared with the frequency fb[i] of the plural peak signals obtained in the aforementioned steps S12, S13 successively (steps S16, S17).

Next, the peak signal which gives the theoretical frequency fc[i,j] of the harmonic beat component which mostly agrees with the frequency fb[i] of the plural peak signals is determined to be the fundamental wave beat component based on a result of comparison of the respective peak signals successively by steps S16, S17 (step S18).

There will be described in detail a case of applying the fundamental wave beat component detecting method according to the first embodiment of the present invention to the measuring target signal P (repetition frequency=about 10 GHz, pulse width=5 picoseconds) having plural harmonic components having similar powers as shown in (a) of FIG. 25.

In the steps S11, S12, the measuring target signal P is sampled with, for example, a sampling frequency 10 MHz and the signal obtained by sampling is analyzed by, for example, fast Fourier transformation method, so that the spectrum as shown in (b) of FIG. 25 is obtained.

In the step S13, of the spectrums obtained in the step S12, a peak signal of a frequency component having a maximum peak power (Pmax) which appears in a band of 5 MHz which is a frequency ½ the sampling frequency or lower is detected first.

Figure 26:
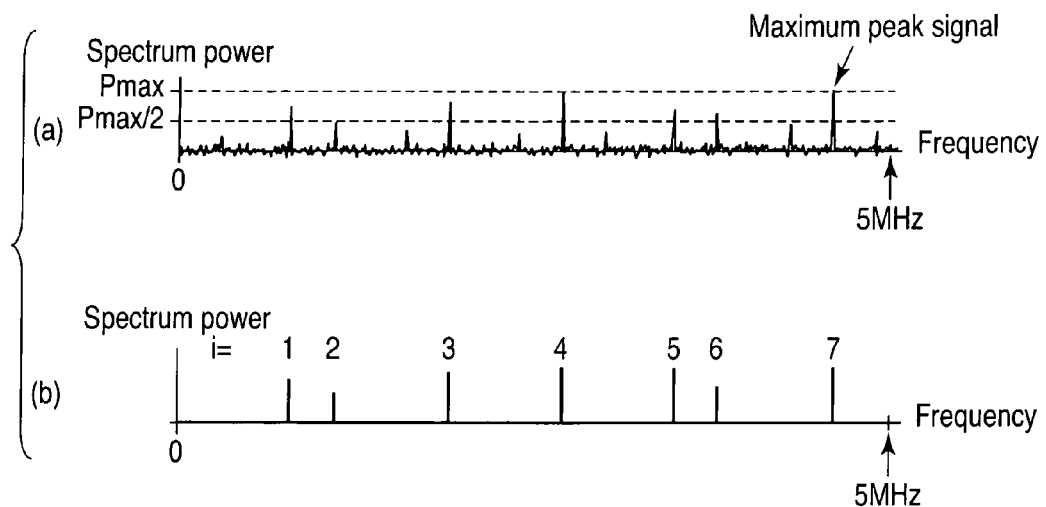
FIG. 26 is a waveform diagram for explaining a case where the fundamental wave beat component detecting method of the first embodiment of the present invention is applied to a signal having plural harmonic components having a similar power as the measuring target signal as shown in (a) of FIG. 25.

Next, as shown in (b) of FIG. 26, seven peak signals having a peak power which is ½ of the maximum peak power (Pmax) are detected.

Next, the frequencies of the detected seven peak signals are obtained in an ascending order of the frequency such that fb[1]=0.8 MHz, fb[2]=1.1 MHz, fb[3]=1.9 MHz, fb[4]=2.7 MHz, fb[5]=3.5 MHz, fb[6]=3.8 MHz, fb[7]=4.6 MHz come in terms of fb[i].

In the aforementioned steps S14, S15, the theoretical frequency fc[i,j] of the harmonic beat component in the case where each peak signal detected in the above-described way is assumed to be a fundamental wave beat component is calculated based on the following equations:

$$fc[i,j]=\mod(j \cdot fb[i], fs) \ldots \text{ in case of } \mod(j \cdot fb[i], fs) < fs/2$$

$$fc[i,j]=fs-\mod(j \cdot fb[i], fs) \ldots \text{ in case of } \mod(j \cdot fb[i], fs) \geq fs/2$$

FIG. 2 is a diagram for explaining how the theoretical harmonic beat component calculated based on the above-mentioned equation is disposed on the frequency axis and, assuming that the peak signal indicated with a numeral 1 is a fundamental wave beat component, the frequency of the harmonic beat component is calculated.

In FIG. 2, numerals 2 to 10 indicate an order of the calculated harmonic beat component and the harmonic beat components of the second or third order are simply disposed at a frequency position times by the order the fundamental wave beat component frequency. In case of a beat component of a higher order than that, the frequency multiplied by the order turns to fs/2 or more, so that a frequency fold-back occurs.

That is, the harmonic beat components of the fourth to seventh order are disposed at frequency positions where the frequency position obtained by multiplying the fundamental wave beat component frequency by the order is folded back around fs/2.

Further, the harmonic beat components of the eighth to tenth order are disposed at frequency positions where the frequency positions obtained by multiplying the fundamental wave beat component frequency by the order is folded back around fs/2 and fs.

In FIG. 2, an arrow A shows a state in which the frequencies are folded back.

Calculation of the theoretical frequency fc[i,j] of this harmonic beat component is carried out for each of seven peak signals (i=1 to 7) detected as described above successively, in case of (b) of FIG. 26.

More specifically, assuming that the peak signal of fb[1] (=0.8 MHz) is a fundamental wave beat component, the theoretical frequency fc[1,j] (j=2 to 7) is calculated as fc[1,j]={1.6, 2.4, 3.2, 4.0, 4.8, 4.4} MHz.

Likewise, in the case where i=2 to 7, following equations are executed successively:

$$fc[2,j]=\{2.2, 3.3, 4.4, 4.5, 3.4, 2.3\} \text{ MHz}$$

$$fc[3,j]=\{3.8, 4.3, 2.4, 0.5, 1.4, 3.3\} \text{ MHz}$$

$$fc[4,j]=\{4.6, 1.9, 0.8, 3.5, 3.8, 1.1\} \text{ MHz}$$

$$fc[5,j]=\{3.0, 0.5, 4.0, 2.5, 1.0, 4.5\} \text{ MHz}$$

$$fc[6,j]=\{2.4, 1.4, 4.8, 1.0, 2.8, 3.4\} \text{ MHz}$$

$$fc[7,j]=\{0.8, 3.8, 1.6, 3.0, 2.4, 2.2\} \text{ MHz}$$

Figure 27:
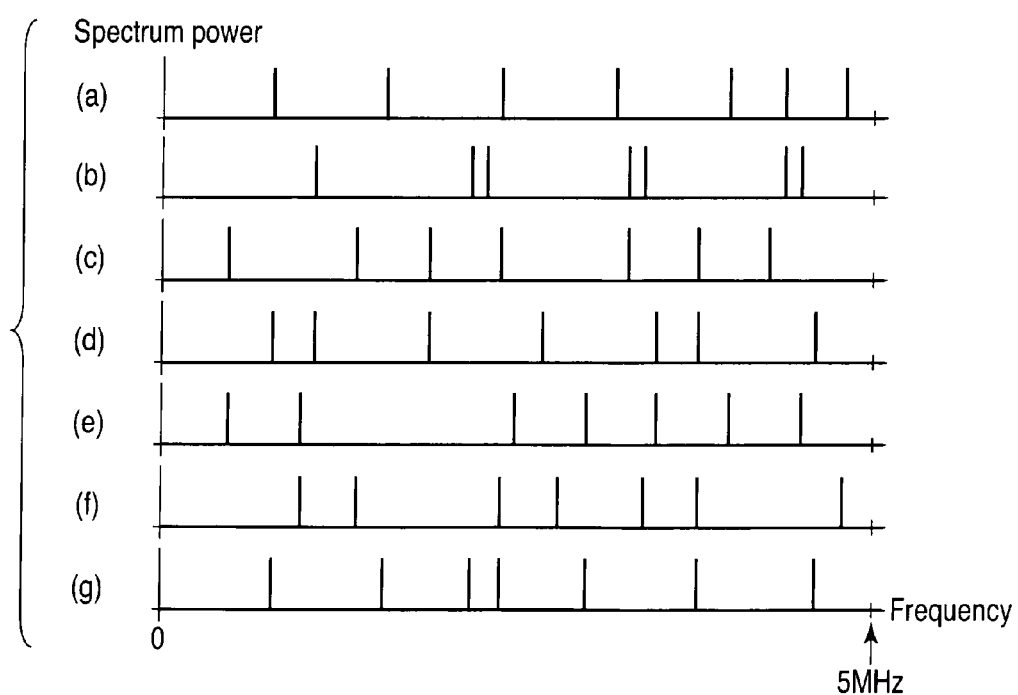
FIG. 27 is a waveform diagram for explaining a case where the fundamental wave beat component detecting method of the first embodiment of the present invention is applied to a signal having plural harmonic components having a similar power as the measuring target signal as shown in (a) of FIG. 25.

The spectrums of the theoretical frequencies of the calculated harmonic beat components are as shown in (a) to (g) of FIG. 27 (it is assumed that the peak powers of the harmonic beat components are all identical).

Here, (a) to (g) of FIG. 27 correspond to each of the spectrum diagrams of the harmonic beat components when it is assumed that the detected plural peak signals are fundamental wave beat component frequencies in the order of their frequencies fb[i], i=1 to 7.

Figure 3:
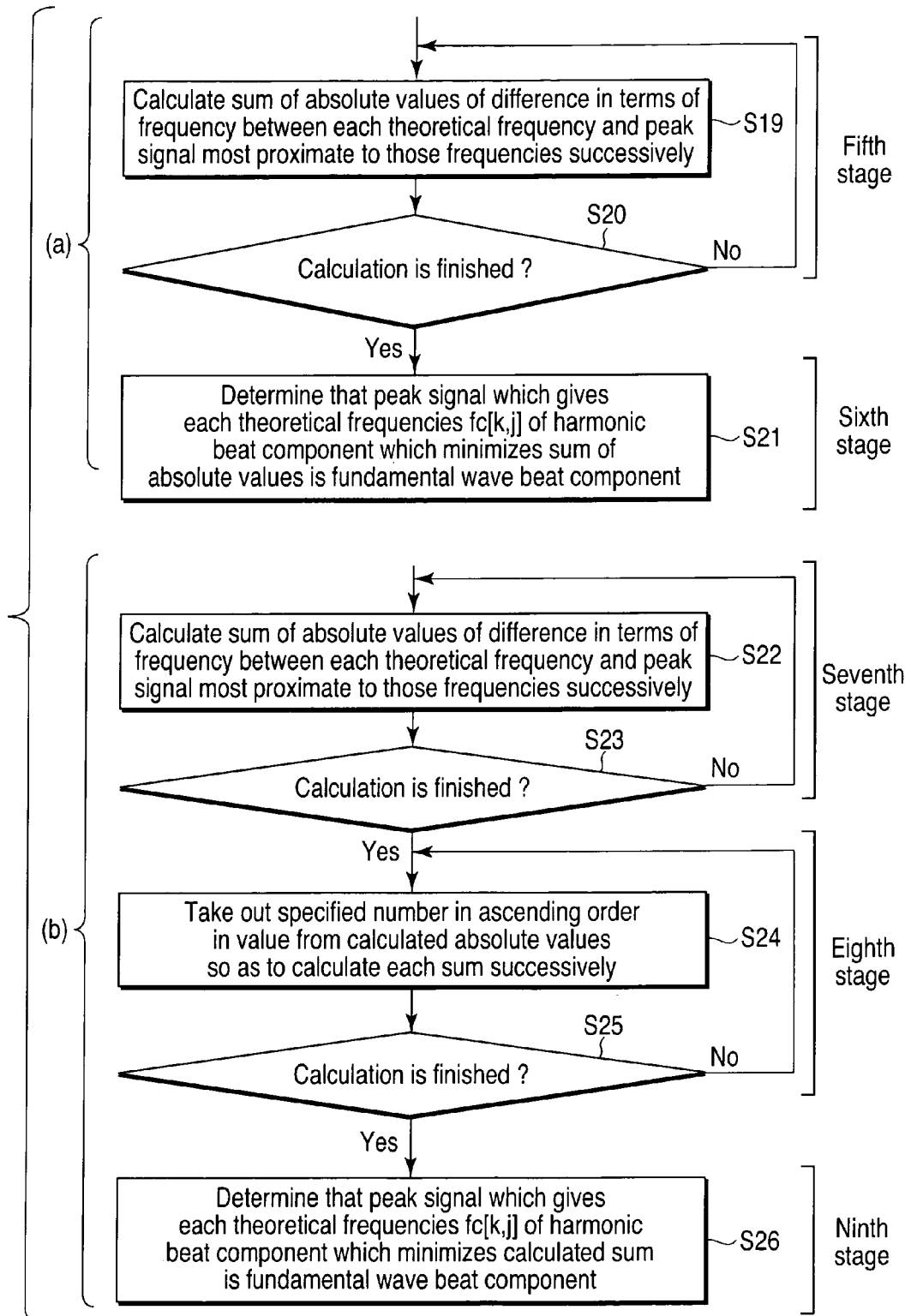
FIG. 3 is a flow chart for explaining the procedure of the fundamental wave beat component detecting method according to the first embodiment of the present invention.

In the steps S16, S17, S18, as shown in (a) of FIG. 3, a sum of absolute values of a difference between the theoretical frequency fc[i,j] of the harmonic beat component and the plural peak signals most proximate to those in terms of the frequency is calculated successively (steps S19, S20). At the same time, the peak signal which gives the theoretical frequency fc[k,j] (k is an integer) of the harmonic beat component when the sum of the absolute values calculated successively for each peak signal in the steps S19, S20 becomes minimum is determined to be the fundamental wave beat component (step S21).

In case of the above-described (a) to (g) of FIG. 27, as elements of fb[i] most proximate to six pieces of the theoretical frequencies fc[1,j] (j=2, 3, 4, ... 7)={1.6, 2.4, 3.2, 4.0, 4.8, 4.4} MHz of the harmonic beat component in the case where fb[1] (=0.8 MHz) is a fundamental wave beat component, {1.9, 2.7, 3.5, 3.8, 4.6, 4.6} MHz are selected successively (at this time, like in this example, an element selected once may be selected in a duplicated manner or it is permissible to permit an element to be selected only once). The absolute values of differences between each selected element and each element of fc[1,j] is calculated as {0.3, 0.3, 0.3, 0.2, 0.2, 0.2} MHz and a sum of these six absolute values, 1.5 MHz is calculated.

Next, for each of 2 to 7 of fc[i,j] (j=2, 3, 4 ... 7), a sum of the absolute values is calculated as described above, and its result is obtained in the form of {1.3, 1.4, 0.0, 1.2, 1.1, 1.2} MHz.

Therefore, in this case, it is determined that the peak signal of i=4 which gives fc[i,j] providing a minimum error 0.0 MHz of the detected seven peak signals is the aforementioned fundamental wave beat component.

As a method for determining which peak component should be assumed to be the fundamental wave beat component when the theoretical frequency fc[i,j] of the harmonic beat component agrees with the actually observed plural peak signal frequencies fb[i] most, as well as the method for calculating the sum of the absolute values as described above, a method of using a square sum, a method of obtaining a correlation and a method of creating a spectrum diagram of the harmonic beat component as shown in (a) to (g) of FIG. 27 and comparing with the spectrums of the actually observed plural peak signals as shown in (b) of FIG. 26 visually may be used.

In case of the spectrum diagram of the harmonic beat component as shown in (a) to (g) of FIG. 27, clearly, the spectrum of (d) of FIG. 27 resembles actually observed plural peak signal spectrums as shown in (b) of FIG. 26, so that a fourth peak signal from the left side of (b) of FIG. 26 can be determined to be the fundamental wave beat component.

As shown in (b) of FIG. 3, by calculating absolute values of differences in terms of the frequency between each theoretical frequency fc[i,j] of the harmonic beat component and the plural peak signal frequencies fb[i] most proximate to those successively (steps S22, S23) and then, taking out a specified number thereof in an ascending order in a value from the absolute values calculated successively for each peak signal in the steps S22, S23 so as to calculate each sum successively (steps S24, S25), it is permissible to determine that the peak signal which gives each theoretical frequency fc[k,j] of the harmonic beat component that minimizes the sum of the absolute values of the specified number calculated successively for each peak signal in the steps S24, S25 is the aforementioned fundamental wave beat component (step S26).

Depending on a measuring target signal, a peak power of the harmonic component of a certain order is sometimes much smaller than a power of the harmonic component of a higher order, in which case a series of continuous harmonic beat components is not detected. Thus, the method shown in (b) of FIG. 3 is a method which takes it into account.

Using the above-described fundamental wave beat component detecting method makes it possible to determine which order of the frequency component each of the plural beat components obtained by sampling the measuring target signal originates from.

That is, the frequency of the harmonic beat component can be obtained according to a calculation equation for the theoretical frequency of the harmonic beat component, based on the frequency of the detected fundamental wave beat component.

Accordingly, according to the fundamental wave beat component detecting method according to the first embodiment of the present invention, a signal obtained by sampling a measuring target signal P with the sampling frequency fs is analyzed so as to obtain a spectrum of that signal. Of the obtained spectrums, plural peak signals which appear in a band ½ of the sampling frequency fs are detected so as to obtain the frequency fb[i] of the plural peak signals. Assuming that each of the plural peak signals is a beat component (fundamental wave beat component) originating from the fundamental wave of the measuring target signal P, each theoretical frequency fc[i,j] (i=1, 2, 3, ..., j=1, 2, 3 ...) of a beat component (harmonic beat component) originating from the harmonic component of the measuring target signal P is calculated successively. The theoretical frequency fc[i,j] of the harmonic beat component calculated successively for each peak signal is compared successively with the frequency fb[i] of the plural peak signals. Based on a result of the comparison in succession for each peak signal, the peak signal which gives the theoretical frequency fc[k,j] (k is an integer) of the harmonic beat component which mostly agrees with the frequencies fb[i] of those plural peak signals is determined to be the fundamental wave beat component. As a result, even if the measuring target signal P is a signal having plural harmonic components having a similar power, the fundamental beat component which is a beat component originating from the fundamental wave component of the measuring target signal P can be detected properly.

(Second Embodiment)

Figure 4:
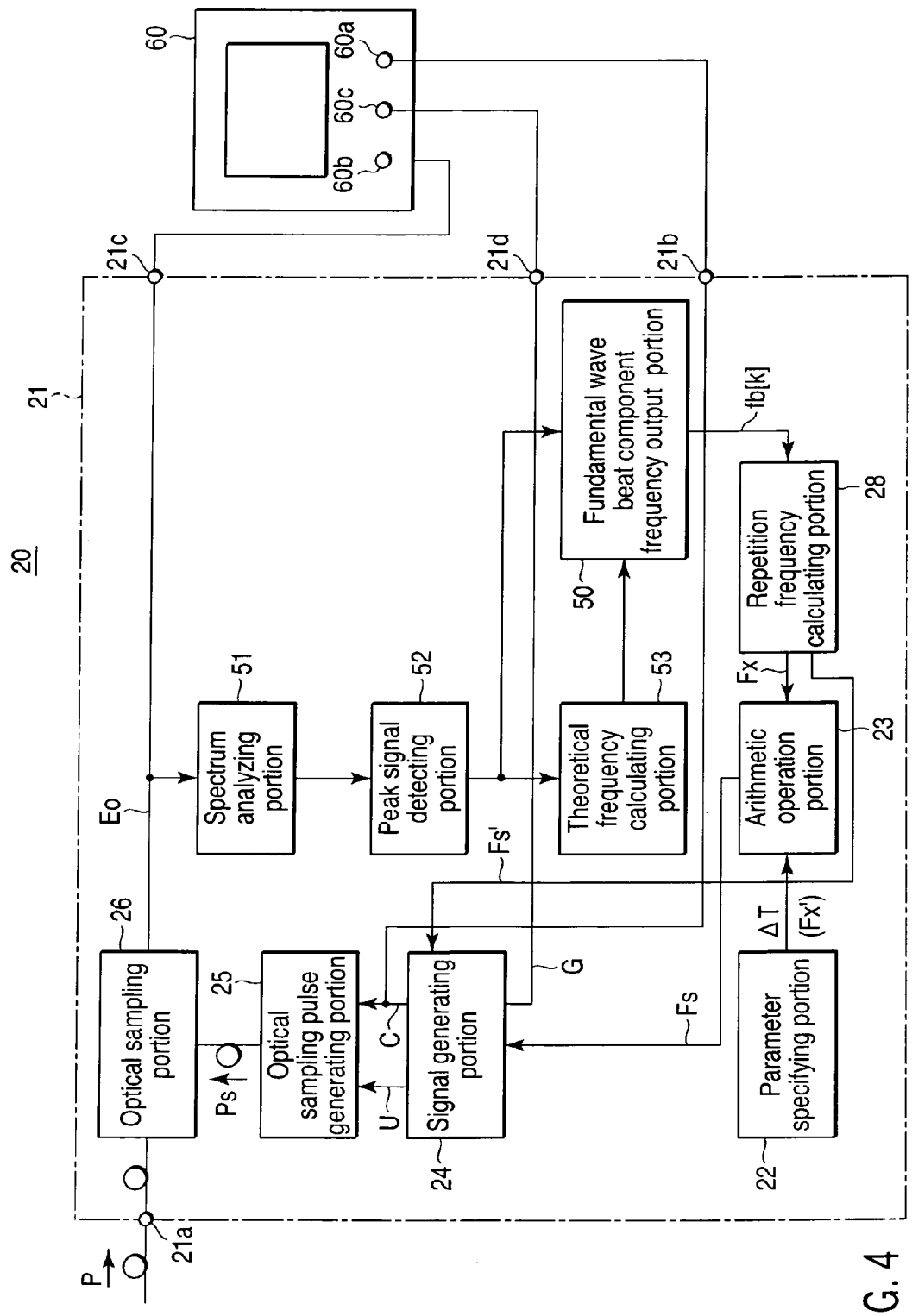
FIG. 4 is a block diagram for explaining the configuration of the waveform observation system containing a sampling apparatus for a measuring target signal according to a second embodiment of the present invention.

FIG. 4 is a block diagram for explaining the structure of the waveform observation system containing the sampling apparatus for the measuring target signal according to the second embodiment of the present invention.

Figure 15:
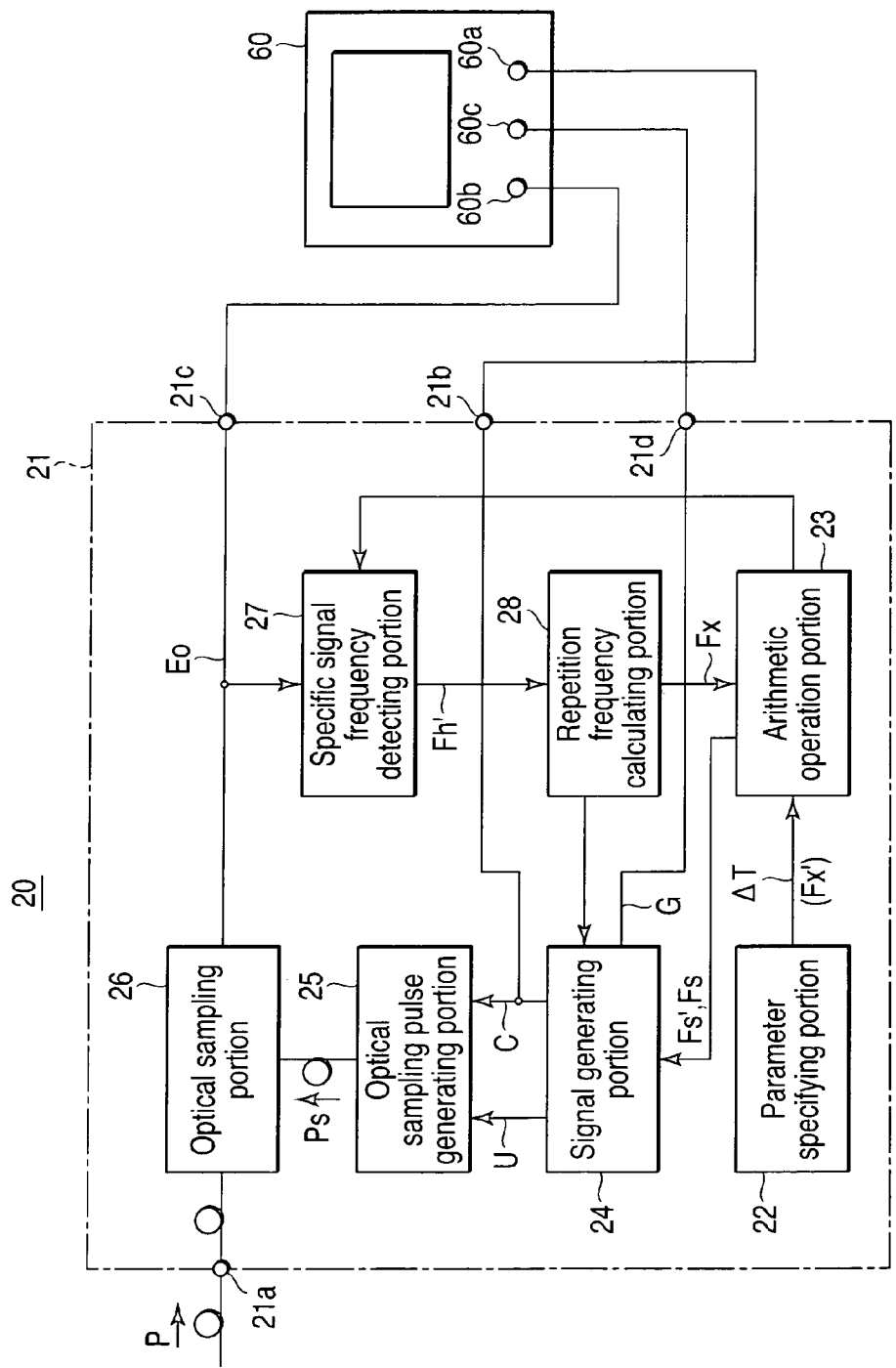
FIG. 15 is a block diagram for explaining the configuration of a waveform observation system containing the sampling apparatus for the measuring target signal according to the earlier application in Japan by this inventor.
Figure 16:
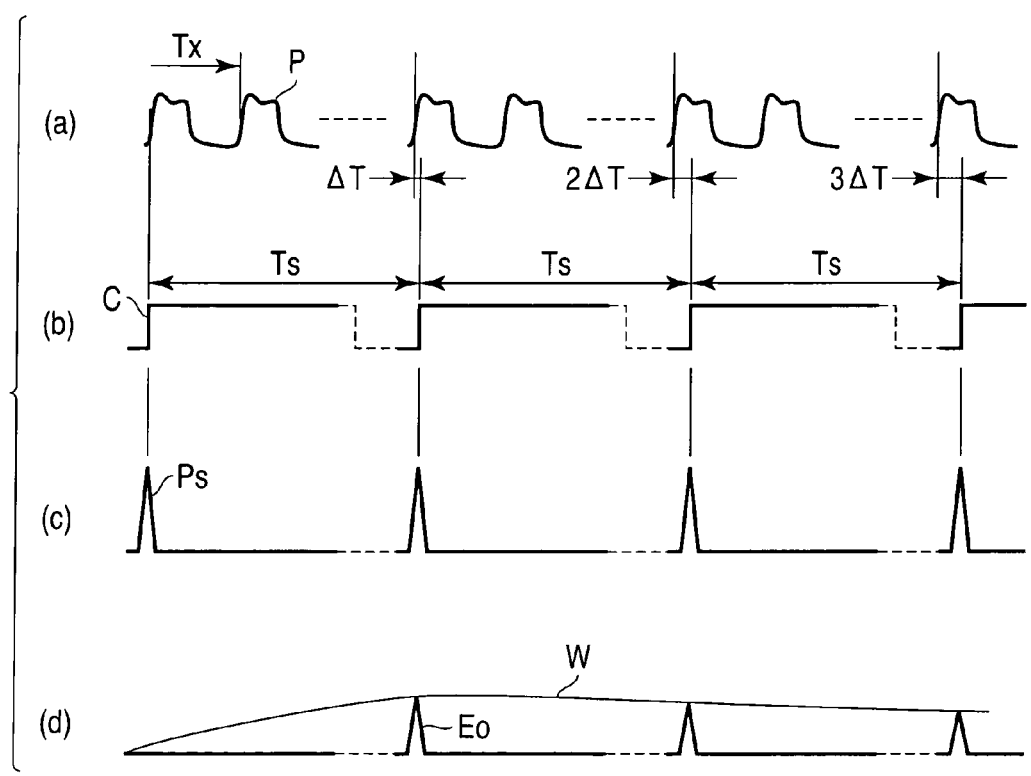
FIG. 16 is a diagram for explaining the operation of major portions of the waveform observation system containing the sampling apparatus for the measuring target signal according to the earlier application in Japan by this inventor.
Figure 17:
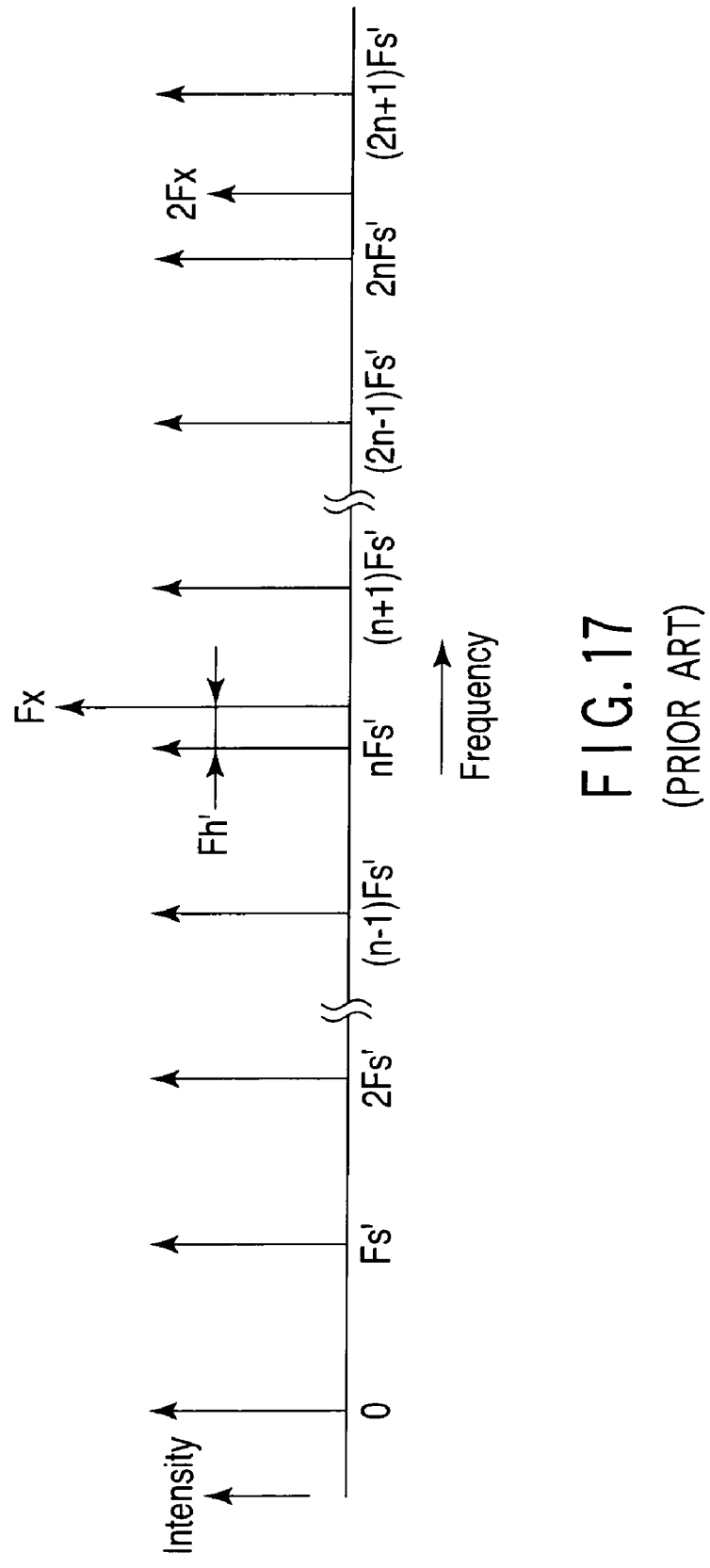
FIG. 17 is a diagram for explaining the operation of major portions of the waveform observation system containing the sampling apparatus for the measuring target signal according to the earlier application in Japan by this inventor.
Figure 18:
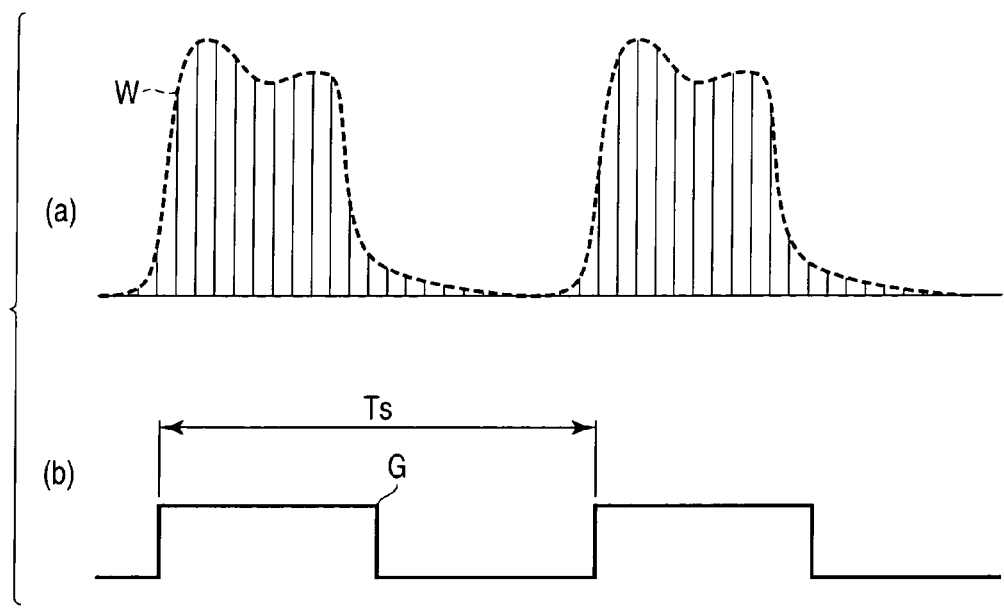
FIG. 18 is a diagram for explaining the operation of major portions of the waveform observation system containing the sampling apparatus for the measuring target signal according to the earlier application in Japan by this inventor.
Figure 19:
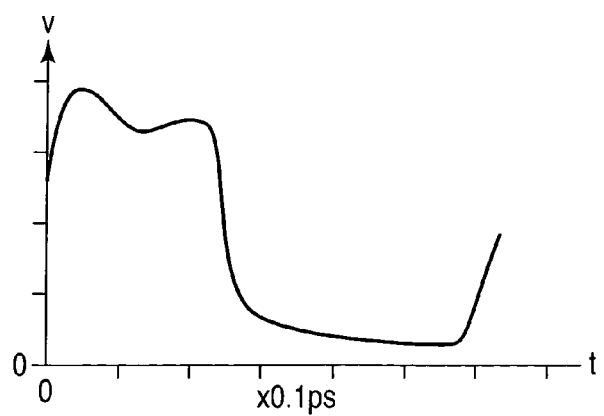
FIG. 19 is a diagram for explaining an example of a waveform observed by the waveform observation system containing the sampling apparatus for the measuring target signal according to the earlier application in Japan by this inventor.
Figure 20:
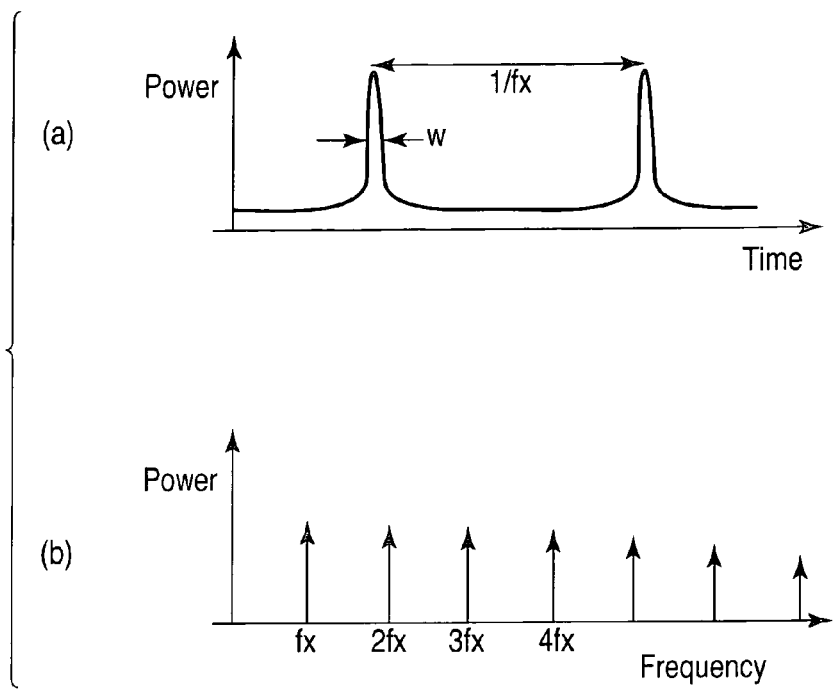
FIG. 20 is a waveform diagram for explaining an example of a case where the measuring target signal is a signal having plural harmonic components having a similar power.
Figure 21:
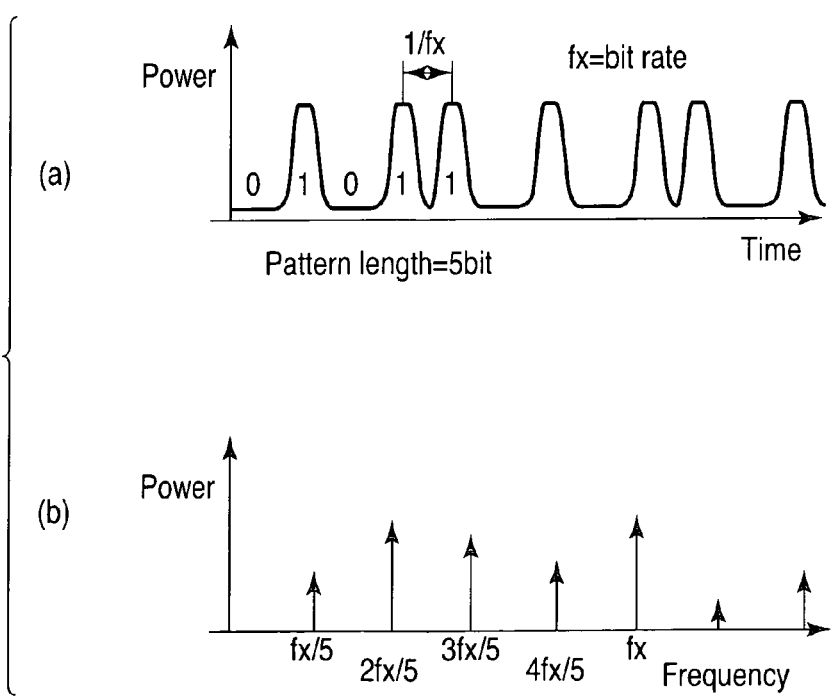
FIG. 21 is a waveform diagram for explaining another example of a case where the measuring target signal is a signal having plural harmonic components having a similar power.
Figure 22:
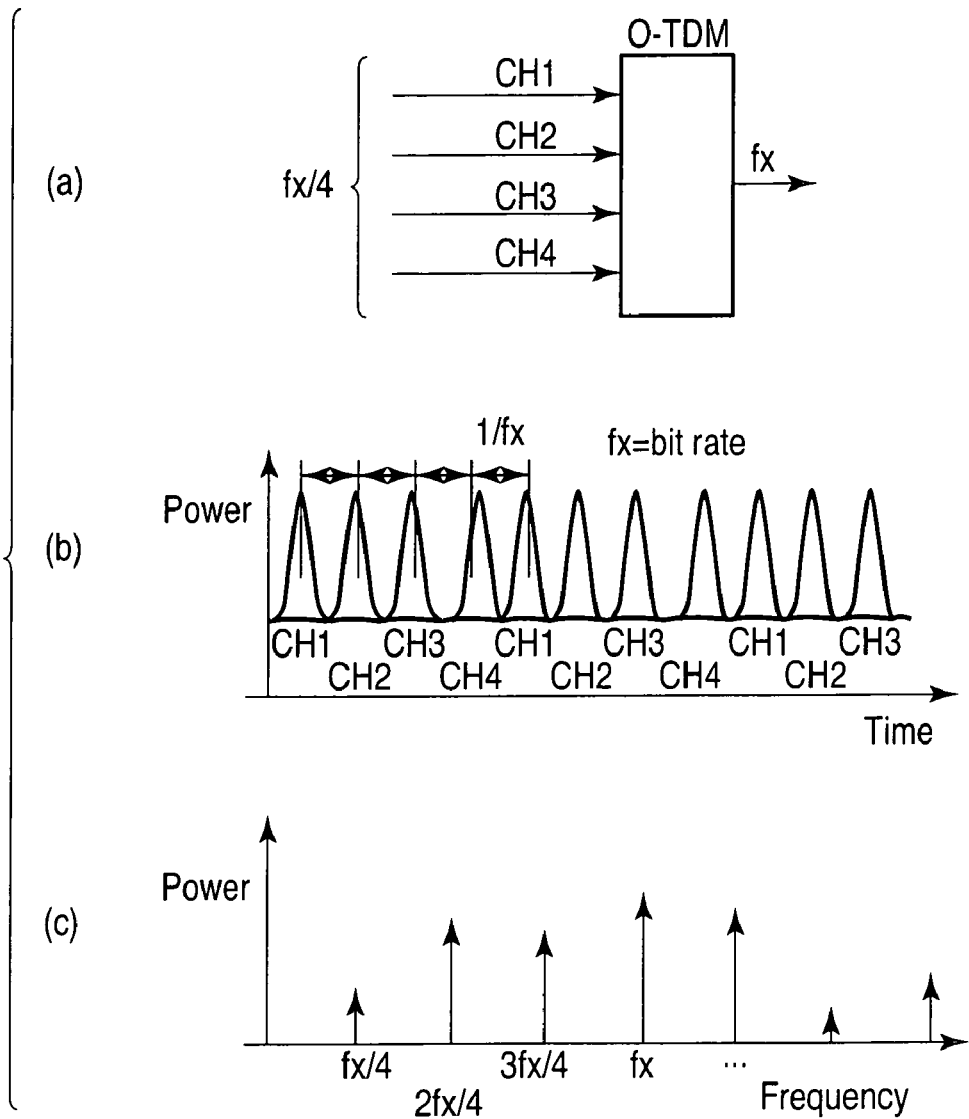
FIG. 22 is a block diagram and a waveform diagram for explaining still another example of a case where the measuring target signal is a signal having plural harmonic components having a similar power.
Figure 23:
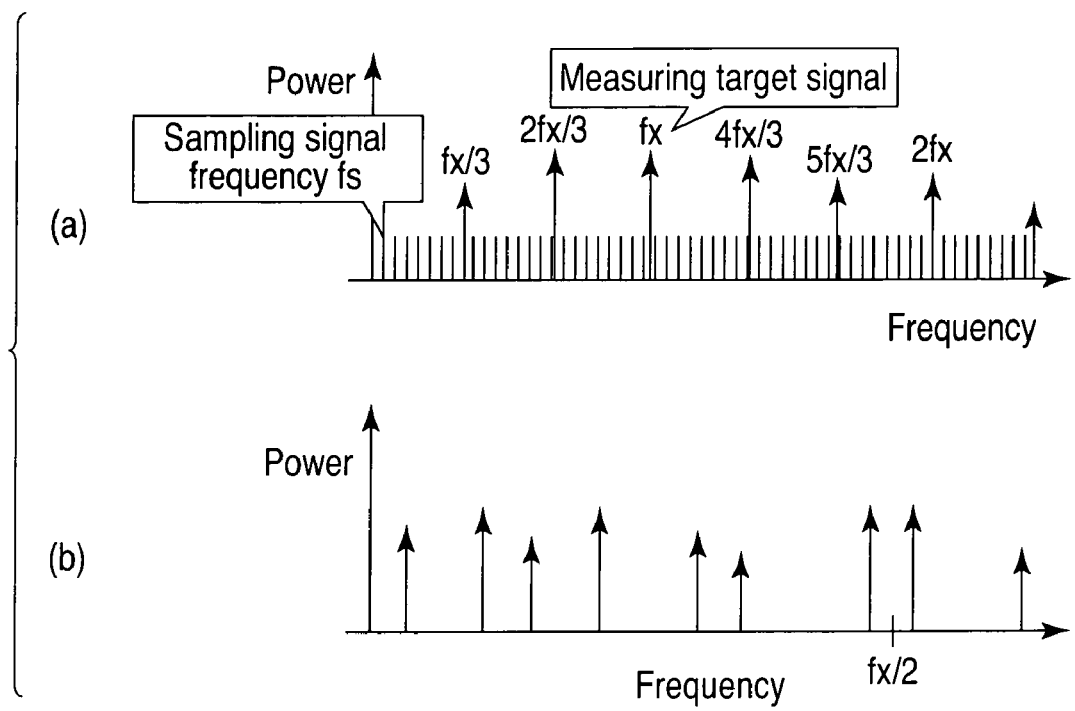
FIG. 23 is a waveform diagram for explaining a different example of a case where the measuring target signal is a signal having plural harmonic components having a similar power.
Figure 24:
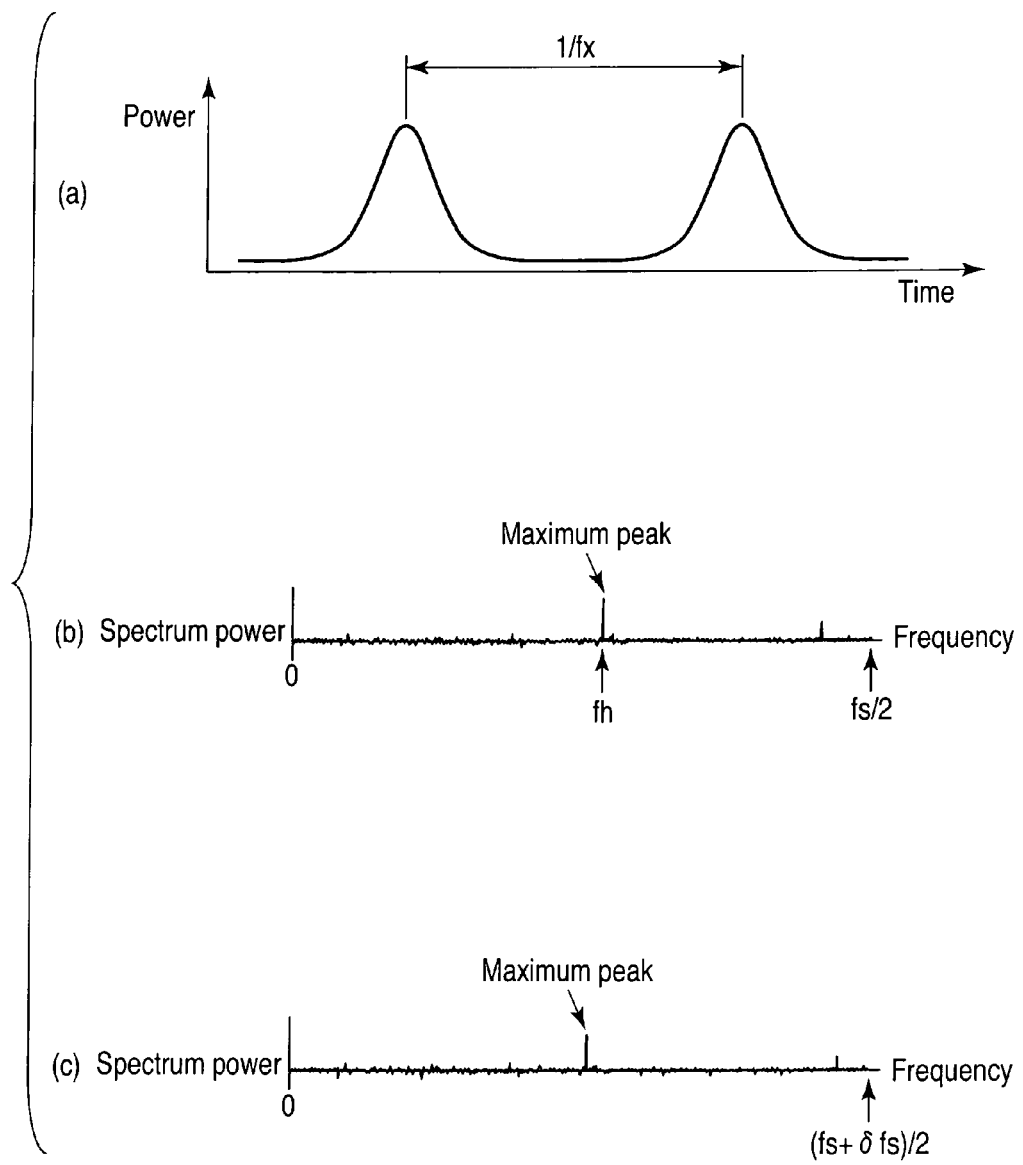
FIG. 24 is a waveform diagram for explaining an operation of the waveform observation system containing the sampling apparatus for the measuring target signal according to the earlier application in Japan by this inventor.

More specifically, as shown in FIG. 4, the waveform observation system 20 of the second embodiment includes the parameter specifying portion 22, the arithmetic operation portion 23, the signal generating portion 24, the sampling pulse generating portion 25, the optical sampling portion 26 and the repetition frequency calculating portion 28, to execute step S11 of the fundamental wave beat component detecting method according to the first embodiment as described above like the waveform observation system 20 containing the sampling apparatus for the measuring target signal according to an earlier application of this inventor shown in FIG. 15.

More specifically, as shown in FIG. 4, the waveform observation system 20 of the second embodiment includes a spectrum analyzing portion 51, a peak signal detecting portion 52, a theoretical frequency calculating portion 53 and a fundamental wave beat component frequency output portion, 50, to execute steps S12 to S18 of the fundamental wave beat component detecting method of the first embodiment as described above, which are not found in the waveform observation system 20 containing the sampling apparatus for the measuring target signal according to the earlier application by this inventor shown in FIG. 15.

In FIG. 4, like reference numerals are attached to components having the same structure as in FIG. 15 and description thereof is omitted while components not described in FIG. 15 will be described below.

The parameter specifying portion 22 specifies information corresponding to a repetition cycle Tx of the waveform of the measuring target signal P and an offset delay time ΔT of the sampling by an operation of an operation portion, not shown, and when the manual setting mode is selected, specifies an accurate repetition cycle Tx while when the automatic setting mode is selected, it specifies its approximate value Tx' or specifies nothing.

In the meantime, this specification information may be not only a cyclic value but also a corresponding frequency value or may be information such as a number which specifies a value from preliminarily set values.

As regards the signal cycle and frequency, if one of them is determined, the other one is automatically specified. Thus, the signal cycle and frequency include a substitution for the "cycle" and its relation with the "frequency" and its relation or conversely a substitution for the "frequency" and its relation with the "cycle" and its relation.

The arithmetic operation portion 23 calculates a sampling cycle Ts (sampling frequency Fs) having a difference of an offset delay time ΔT with respect to an integer (N) times the repetition cycle Tx (or its approximate value Tx') of the measuring target signal P, based on information specified by the parameter specifying portion 22 or the fundamental wave frequency information of the measuring target signal P output by the repetition frequency calculating portion 28 described later.

Further, this arithmetic operation portion 23 calculates a time necessary for obtaining data of a single cycle of the waveform which is an object for observation in a calculated sampling cycle under a resolution of $\Delta T$ as a trigger cycle Tg (frequency Fg).

That is, a certain sampling frequency Fs(=1/Ts) can be obtained by arithmetic operation of Fs=Fx/(N+Fx·$\Delta T$) from the relation of Ts=N·Tx+$\Delta T$.

Further, the trigger frequency Fg can be obtained by arithmetic operation of Fg=mod[Fx, Fs]=Fs·Fx·$\Delta T$ as described previously.

Assuming that Fx=1 GHz, $\Delta T$=0.1 ps and the setting enable range of the sampling frequency Fs is 10 MHz±1 kHz, an integer N in which $10^9/(N+10^9 \cdot 0.1 \times 10^{-12})$ falls under a range of 9.999 MHz to 10.001 MHz is obtained and for that N, a frequency Fs which satisfies Fs=Fx/(N+Fx·$\Delta T$) is obtained. As a result, N=100, Fs=9.99999 MHz is obtained in the above numeric example.

The trigger frequency Fg of the above-mentioned numeric example is Fg=Fs·Fx·$\Delta T$=9.99999×$10^6$·1×$10^9$·0.1×$10^{-12}$= 9.99999×$10^2$ (MHz)

The signal generating portion 24 generates and outputs a clock signal C for the sampling frequency Fs calculated by the arithmetic operation 23 or the temporary sampling frequency Fs' specified by the repetition frequency calculating portion 28, a high frequency signal U necessary for generating a narrow pulse beam by the optical sampling pulse generating portion 25 and a trigger signal G for the frequency Fg.

Although this signal generating portion 24 may have any structure, it is constructed so as to generate a signal U by multiplying, for example, a stable, high precision reference signal (for example, 1 GHz±1 MHz) and then generate the aforementioned clock signal C and the trigger signal G by dividing that signal U.

The optical sampling pulse generating portion 25 generates an optical sampling pulse Ps having the same cycle as the clock signal C output by the signal generating portion 24.

The pulse width of the optical sampling pulse Ps generated by the optical sampling pulse generating portion 25 determines the upper limit of the time resolution of sampling and as the pulse width is decreased, the sampling can be performed with a higher time resolution.

Figure 5:
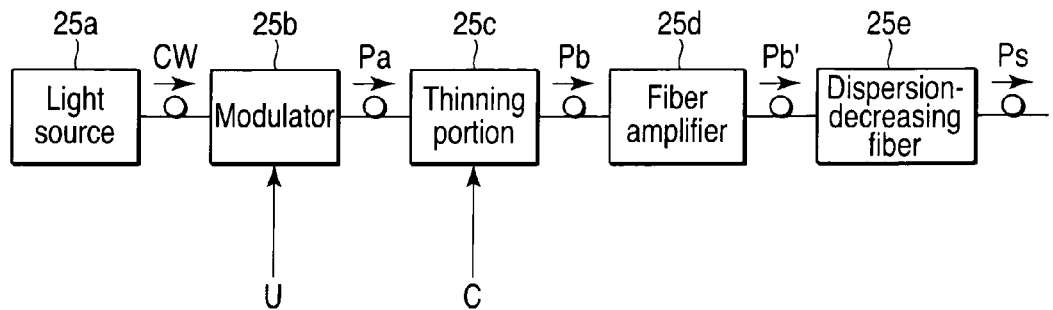
FIG. 5 is a block diagram showing an example of the configuration of the major portion of a waveform observation system containing the sampling apparatus for the measuring target signal according to the second embodiment of the present invention.

In order to obtain this narrow optical sampling pulse in the optical sampling pulse generating portion 25, as shown in FIG. 5, continuous beam CW emitted from a light source 25a is entered into a modulator 25b and modulated with the signal U so as to generate a pulse beam Pa having a relatively small width as shown in FIG. 6A at a cycle Tu of the signal U and that pulse beam Pa is input to a thinning portion 25c.

Figure 6:
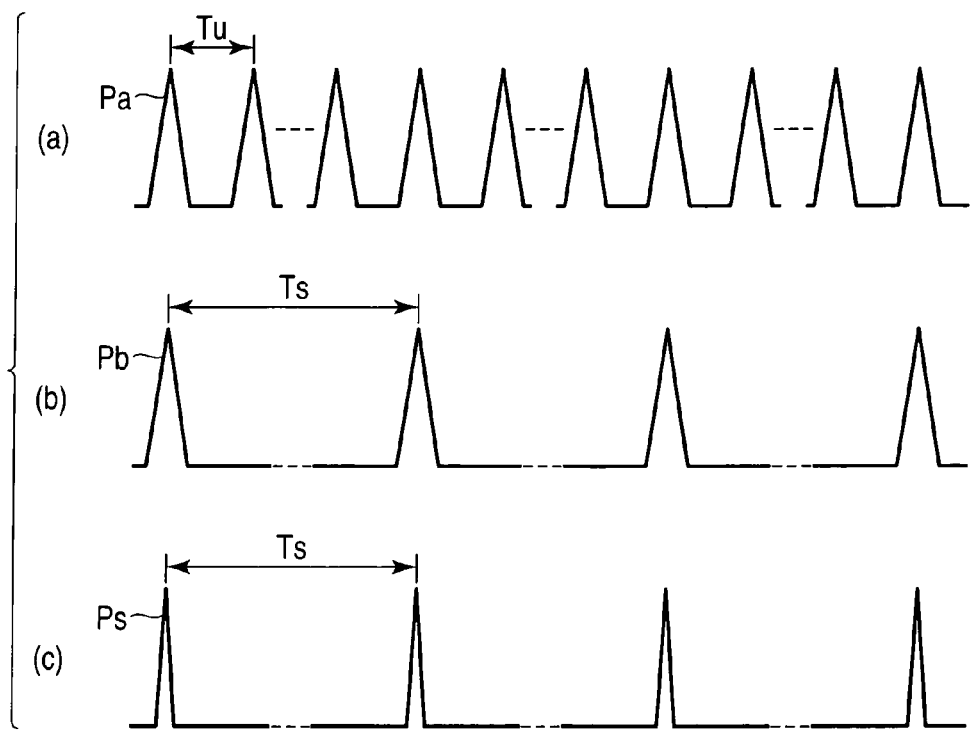
FIG. 6 is a diagram for explaining an operation of the major portion of the waveform observation system containing the sampling apparatus for the measuring target signal according to the second embodiment of the present invention.

The thinning portion 25c has an optical switch which is turned ON only for a short time interval at the cycle of the clock signal C and outputs a pulse beam Pb having a cycle Ts of the clock signal C as shown in (b) of FIG. 6.

This pulse beam Pb is input to an automatic gain control type fiber amplifier 25d and amplified to a pulse beam Pb' having an appropriate intensity and entered into a dispersion-decreasing fiber 25e.

From the dispersion-decreasing fiber 25e which receives this appropriate intensity pulse beam Pb', as shown in FIG. 6C, optical sampling pulse Ps having a small width (for example, 0.1 ps or less) is emitted at a cycle Ts.

Figure 7:
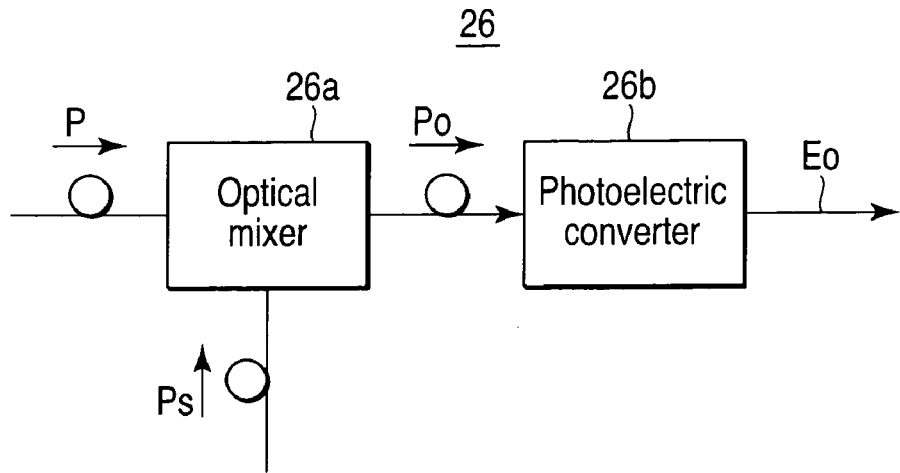
FIG. 7 is a block diagram showing an example of the configuration of the major portion of the waveform observation system containing the sampling apparatus for the measuring target signal according to the second embodiment of the present invention.

As shown in FIG. 7, for example, the optical sampling portion 26 includes an optical mixer 26a and a photoelectric converter 26b and an optical signal P input from an input terminal 21a and an optical sampling pulse Ps are input to the optical mixer 26a, which samples the measuring target signal P with the optical sampling pulse Ps and converts the pulse beam Po obtained by that sampling to an electric pulse signal Eo with the photoelectric converter 26b for output.

The spectrum analyzing portion 51 receives the pulse signal Eo which is sampled with the sampling pulse Ps by the optical sampling portion 26 and output so as to obtain a spectrum of that signal Eo.

Of spectrums obtained by the spectrum analyzing portion 51, the peak signal detecting portion 52 detects plural peak signals which appear in a band ½ the sampling frequency or lower.

Figure 8:
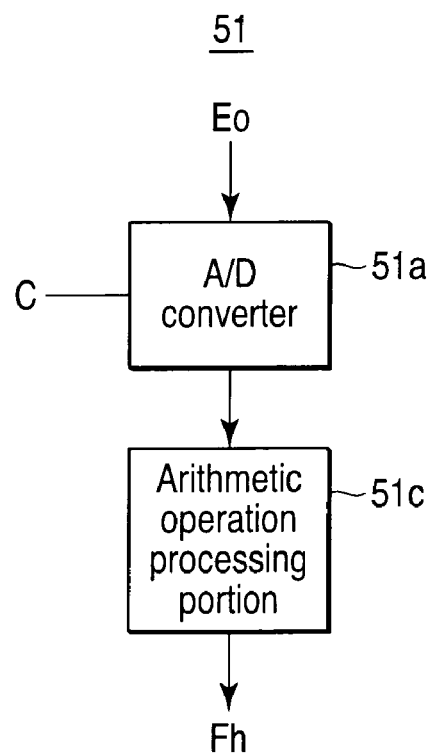
FIG. 8 is a block diagram showing an example of the configuration of the major portion of the waveform observation system containing the sampling apparatus for the measuring target signal according to the second embodiment of the present invention.
Figure 10:
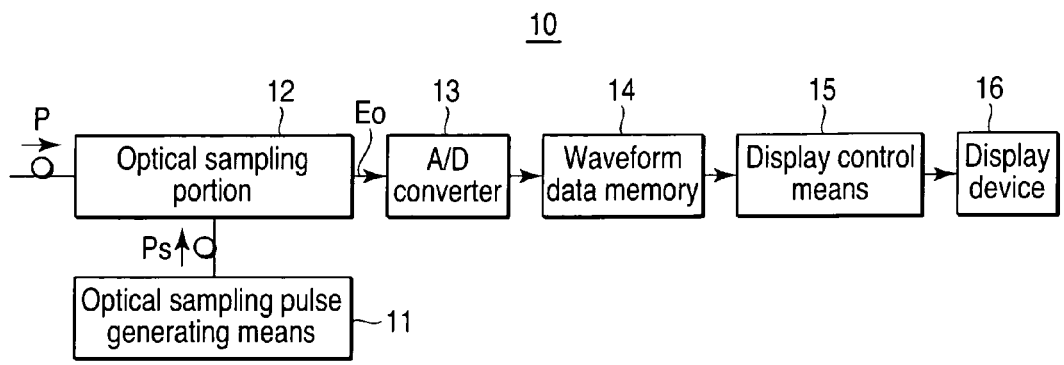
FIG. 10 is a block diagram for explaining the configuration of a conventional waveform observation unit.
Figure 11:
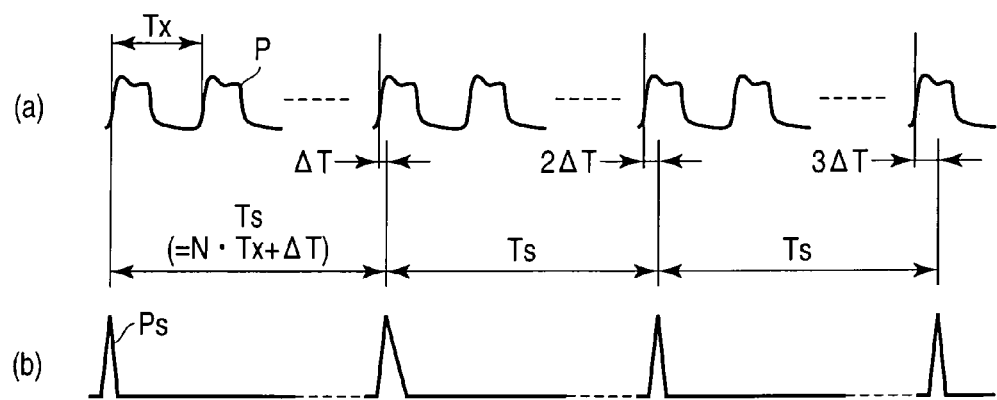
FIG. 11 is a diagram for explaining an operation of the conventional waveform observation unit.
Figure 12:
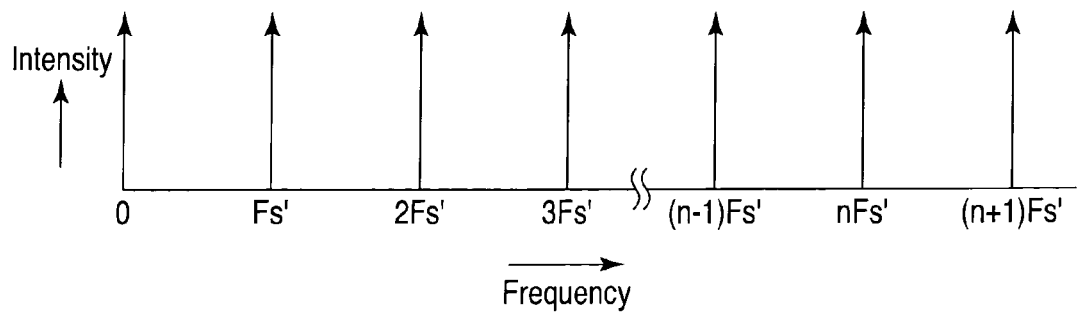
FIG. 12 is a diagram for explaining the principle of the repetition frequency detecting method for the measuring target signal according to an earlier application in Japan by this inventor.
Figure 13:
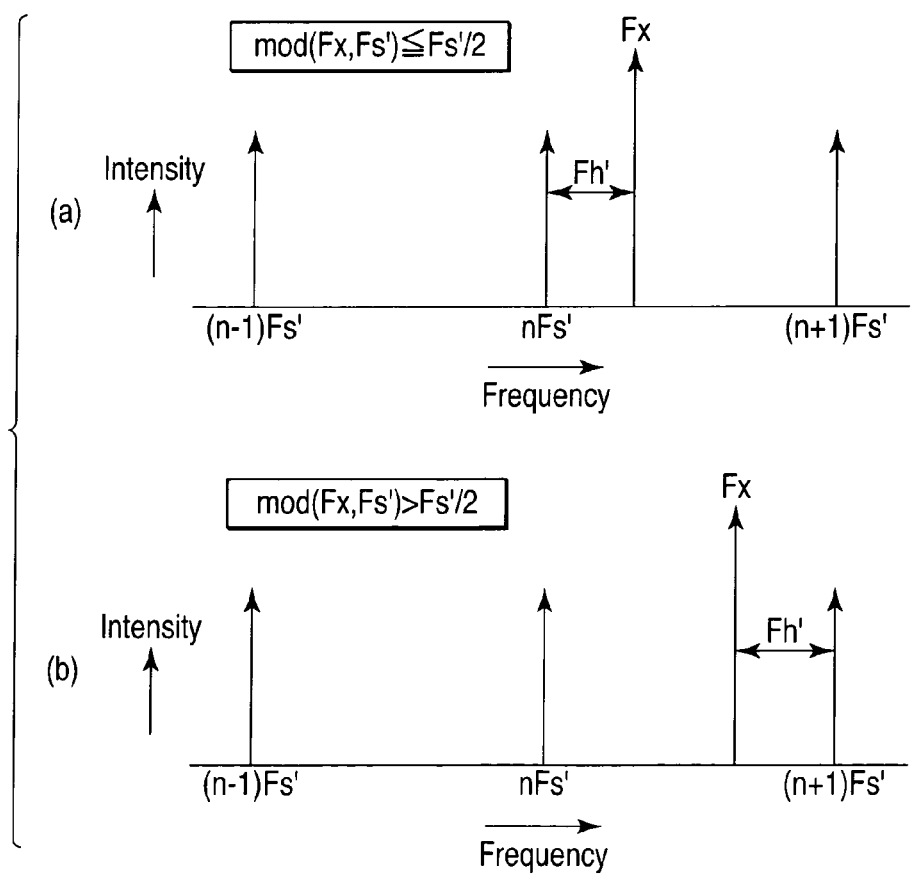
FIG. 13 is a diagram for explaining the principle of the repetition frequency detecting method for the measuring target signal according to the earlier application in Japan by this inventor.
Figure 14:
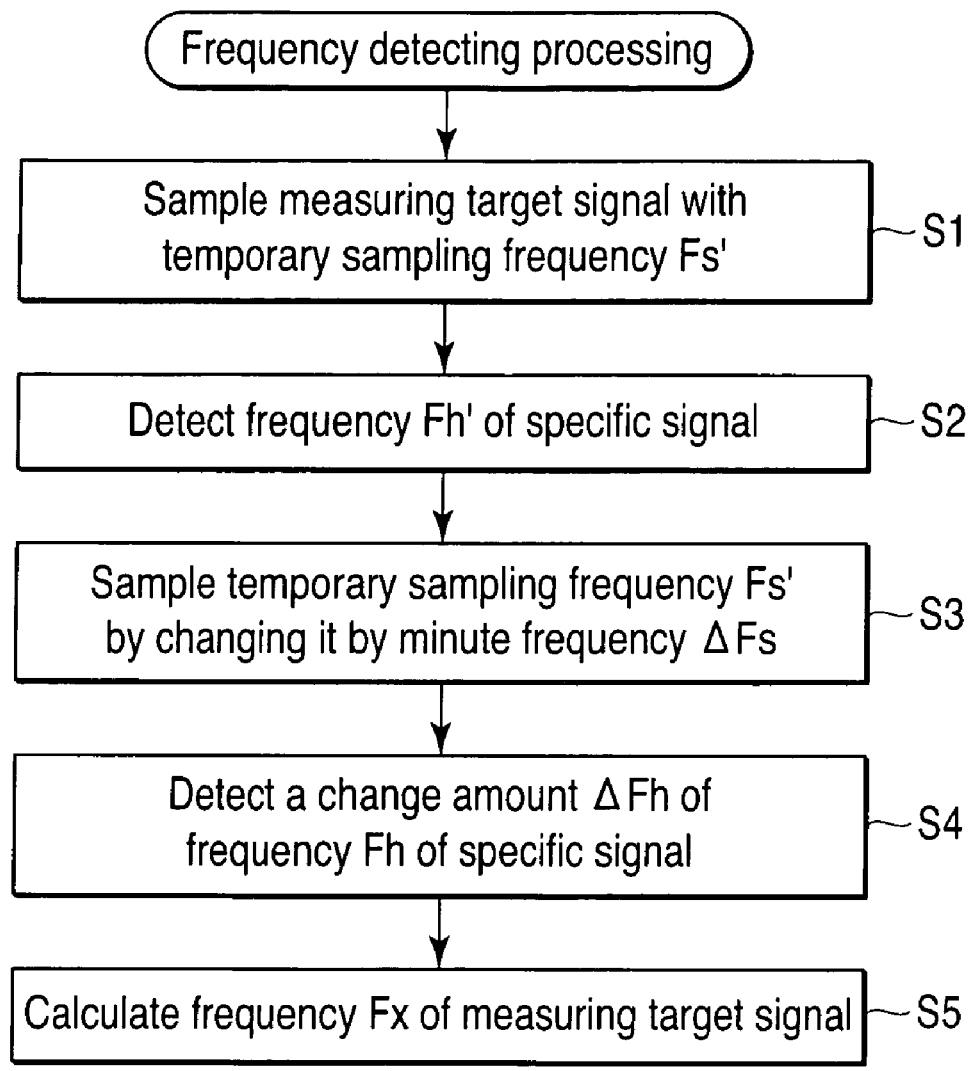
FIG. 14 is a flow chart for explaining the repetition frequency detecting method for the measuring target signal according to the earlier application in Japan by this inventor.

Here, in the spectrum analyzing portion 51 and the peak signal detecting portion 52, as shown in FIG. 8, the pulse signal Eo is input to the A/D converter 51a and its peak value is sampled synchronously with the clock signal C and converted to a digital value. Its digital value string is subjected to a processing such as FFT (fast Fourier transformation) arithmetic operation by the arithmetic operation processing portion 51c so as to calculate a spectrum. Plural peak signals which appear in a band ½ the sampling frequency or lower are detected from that spectrum so as to obtain the frequency Fb[i] of those plural peak signals.

The theoretical frequency calculating portion 53 calculates each theoretical frequency Fc[i,j] (i=1, 2, 3 . . . , j=1, 2, 3 . . . ) of the beat component (harmonic beat component) successively originating from the harmonic component of the measuring target signal P by assuming that each of the plural peak signals detected by the peak signal detecting portion 52 is a beat component (fundamental wave beat component) originating from the fundamental wave of the measuring target signal P and supplies it to the fundamental wave beat component frequency output portion 50.

The fundamental wave beat component frequency output portion 50 compares each theoretical frequency Fc[i,j] of the harmonic beat component of each of the plural peak signals calculated by the theoretical frequency calculating portion 53 successively for each peak signal with the frequency Fb[i] of the plural peak signals obtained by the peak signal detecting portion 52. It is determined that the peak signal which gives each theoretical frequency Fc[k,j] (k is an integer) of the harmonic beat component which agrees most is the fundamental wave beat component (specific signal) and that frequency Fb[k] is regarded as a specific signal frequency (Fh') and output to the repetition frequency calculating portion 28.

The repetition frequency calculating portion 28 is activated when the automatic setting mode is specified in the parameter specifying portion 22 and first, specifies the temporary sampling frequency Fs' for the signal generating portion 24 and, when the measuring target signal P is sampled with the temporary sampling frequency Fs', the specific signal frequency Fh' to be output from the fundamental wave beat component frequency output portion 50 stores.

Next, the repetition frequency calculating portion 28 instructs the signal generating portion 24 to change the temporary sampling frequency only by a minute amount $\Delta$Fs and when the measuring target signal P is sampled with the sampling frequency changed only by that minute amount $\Delta$Fs, calculates a frequency change amount $\Delta$Fh according to the specific signal frequency output from the fundamental wave beat component frequency output portion 50. Then, an accurate repetition frequency Fx is calculated based on the temporary sampling frequency Fs', its corresponding specific signal frequency Fh', the change amount $\Delta$Fs of the temporary sampling frequency and its corresponding specific signal frequency change amount $\Delta$Fh and output to the arithmetic operation portion 23.

Next, an operation of the waveform observation system containing the sampling apparatus for the measuring target signal according to the second embodiment of the present invention will be described.

First, a measuring target signal P (repetition frequency=about 10 GHz, pulse width=about 5 picoseconds) as shown in (a) of FIG. 25 is input to the input terminal 21a and with an operating portion, not shown, an offset delay time ΔT (for example, 100 picoseconds) of the sampling and the automatic setting mode are specified in the parameter specifying portion 22.

Accompanied by setting of the automatic setting mode, the repetition frequency calculating portion 28 starts its operation and specifies, for example, 10 MHz for the signal generating portion 24 as a temporary sampling frequency.

The signal generating portion 24 outputs a clock signal C having the specified frequency of 10 MHz to the sampling pulse generating portion 25 and then, a sampling pulse Ps is output to the optical sampling portion 26 from the sampling pulse generating portion 25 synchronously with the clock signal C.

The measuring target signal P input to the input terminal 21a is sampled with the sampling pulse Ps output from the sampling pulse generating portion 25 in the optical sampling portion 26 and converted to an electric signal Eo and output.

The spectrum analyzing portion 51 which receives the electric signal Eo analyzes that signal and outputs, for example, a spectrum as shown in (b) of FIG. 25 described previously.

As shown with an arrow of (a) of FIG. 26 described previously, the peak signal detecting portion 52 which receives this spectrum detects a frequency component having a maximum peak power in a band less than 5 MHz which is ½ the temporary sampling frequency from this spectrum and detects seven peak signals having a peak power more than Pmax/2, where the peak power of the frequency component is (Pmax) (the above-described FIG. 26B).

Then, those frequencies (Fb[1]=0.8 MHz, Fb[2]=1.1 MHz, Fb[3]=1.9 MHz, Fb[4]=2.7 MHz, Fb[5]=3.5 MHz, Fb[6]=3.8 MHz, Fb[7]=4.6 MHz) are calculated and output to the theoretical frequency calculating portion 53 and the fundamental wave beat component frequency output portion 50.

In the theoretical frequency calculating portion 53 which receives the frequencies Fb[i] of the plural peak signals, each theoretical frequency Fc[i,j] of the harmonic beat component is calculated in the case where it is assumed that each peak signal detected is a fundamental wave beat component, based on the following equations:

$Fc[i,j]=\mod(j \cdot Fb[i], Fs') \ldots$
in case of $\mod(j \cdot Fb[i], Fs')<Fs'/2$ $Fc[i,j]=Fs'-\mod(j \cdot Fb[i], Fs') \ldots$
in case of $\mod(j \cdot Fb[i], Fs') \geq Fs'/2$.

In the case of (b) of FIG. 26 described before, each frequency Fb[i] (i=1 to 7) of the seven peak signals is calculated successively and the theoretical frequency Fc[1,j] (j=2, 3, 4 ... 7) in the case where Fb[1] (=0.8 MHz) is assumed to be the fundamental wave beat component is calculated as Fc[1, j]={1.6, 2.4, 3.2, 4.0, 4.8, 4.4} MHz. In case of i=2 to 7 also, the following calculations are made successively:

Fc[2,j]={2.2, 3.3, 4.4, 4.5, 3.4, 2.3} MHz

Fc[3,j]={3.8, 4.3, 2.4, 0.5, 1.4, 3.3} MHz

Fc[4,j]={4.6, 1.9, 0.8, 3.5, 3.8, 1.1} MHz

Fc[5,j]={3.0, 0.5, 4.0, 2.5, 1.0, 4.5} MHz

Fc[6,j]={2.4, 1.4, 4.8, 1.0, 2.8, 3.4} MHz

Fc[7,j]={0.8, 3.8, 1.6, 3.0, 2.4, 2.2} MHz

Their results are output to the fundamental wave beat component frequency output portion 50.

The fundamental wave beat component frequency output portion 50 which receives the theoretical frequency Fc[i,j] of the harmonic beat component and the frequency Fb[i] of the plural peak signals output from the peak signal detecting portion 52 calculates a sum of the absolute values of differences between the theoretical frequency Fc[i,j] of the harmonic beat component and the plural peak signals most proximate to those in terms of the frequency successively. Then, the peak signal which gives the theoretical frequency Fc[k,j] (k is an integer) of the harmonic beat component which minimizes the sum of the absolute values calculated successively for each peak signal of the plural peak signals is determined to be the fundamental wave beat component (specific signal) originating from the fundamental wave of the measuring target signal P and the frequency Fb[k] of the peak signal is output as the specific signal frequency (Fh').

In the case of (b) of FIG. 26 described above, first, as an element of the Fb[i] most proximate to six elements of the theoretical frequencies Fc[1,j] (j=2, 3, 4, ... 7)={1.6, 2.4, 3.2, 4.0, 4.8, 4.4} MHz of the harmonic beat component when it is assumed that Fb[1] (=0.8 MHz) is a fundamental wave beat component, {1.9, 2.7, 3.5, 3.8, 4.6, 4.6} MHz are selected successively (at this time, an element already selected may be selected redundantly or it is permissible to permit an element to be selected only once). Absolute values of differences between each selected element and each element of Fc[1,j] is calculated as {0.3, 0.3, 0.3, 0.2, 0.2, 0.2} MHz and a sum 1.5 MHz of these six absolute values is calculated.

Next, the sum of the absolute values is calculated in the case where i of Fc[i,j] (j=2, 3, 4, ... 7) is 2 to 7 as described above and its result is calculated as {1.3, 1.4, 0.0, 1.2, 1.1, 1.2} MHz.

Then, in this case, the peak signal of i=4 which gives Fc[4,j] which provides the smallest error 0.0 MHz of the detected seven peak signals is determined to be the fundamental wave beat component and its frequency Fb[4]=2.7 MHz is output to the repetition frequency calculating portion 28 as the specific signal frequency Fh'.

In the fundamental wave beat component frequency output portion 50, by calculating the absolute values of differences between each theoretical frequency Fc[1,j] of the harmonic beat component and the plural peak signals most proximate to those in terms of the frequency successively and taking out a specified number from the absolute values calculated successively in an ascending order in a value so as to calculate each sum successively, it is permissible to determine that the peak signal which gives each theoretical frequency Fc[k,j] (k is an integer) of the harmonic beat component which minimizes the sum of the absolute values of the specified number calculated successively is the fundamental wave beat component so that its frequency Fb[k] is output to the repetition frequency calculating portion 28 as the specific signal frequency Fh'.

When the specific signal frequency Fh' (=2.7 MHz) about the temporary sampling frequency Fs' (=10 MHz) is obtained, the repetition frequency calculating portion 28 stores the frequency Fh' of this specific signal and instructs the signal generating portion 24 to change the sampling frequency by only a predetermined minute amount (for example, 100 Hz).

The temporary sampling frequency with respect to the measuring target signal P is raised by 100 Hz by the signal generating portion 24 which receives this instruction and a spectrum as shown in (c) of FIG. 25 is output from the spectrum analyzing portion 51.

Figure 28:
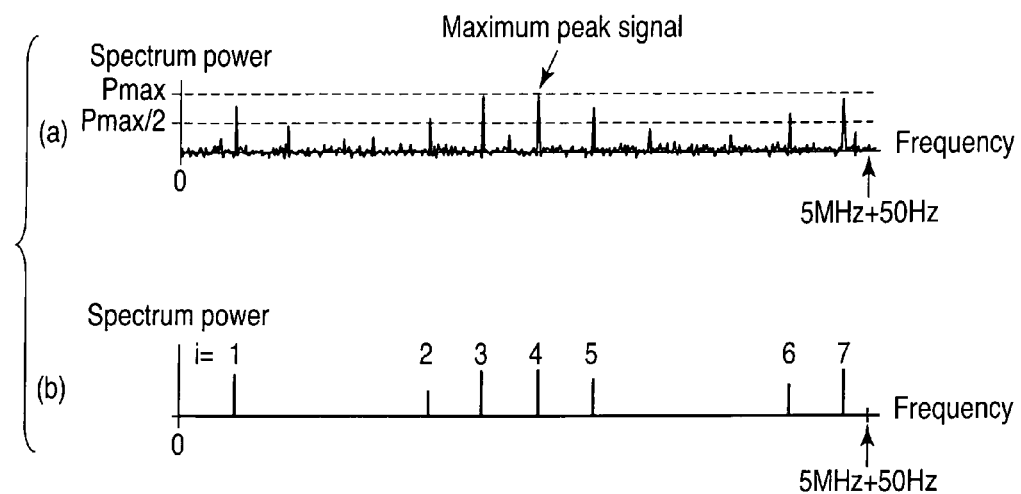
FIG. 28 is a waveform diagram for explaining an operation of the waveform observation system containing the sampling apparatus for the measuring target signal according to the second embodiment of the present invention.

The peak signal detecting portion 52 which receives this spectrum detects seven peak signals having a peak power over Pmax/2 which is half of the maximum peak Pmax as indicated with an arrow in (a) of FIG. 28, as shown in (b) of FIG. 28 and their frequencies (Fb[1]=0.3999 MHz, Fb[2]=1.8002 MHz, Fb[3]=2.2001 MHz, Fb[4]=2.6 MHz, Fb[5]=2.9999 MHz, Fb[6]=4.4002 MHz, Fb[7]=4.8001 MHz) are calculated and output to the theoretical frequency calculating portion 53 and the fundamental wave beat component frequency output portion 50.

In the theoretical frequency calculating portion 53 which receives the frequencies Fb[i] (i=1 to 7) of these plural peak signals, as described previously, each theoretical frequency Fc[i,j] of the harmonic beat component in the case where it is assumed that each of the seven peak signals is a fundamental wave beat component is calculated successively as follows, so as to output their results to the fundamental wave beat component frequency output portion 50:

Fc[1,j]={0.7998, 1.1997, 1.5996, 1.9995, 2.3994, 2.7993} MHz

Fc[2,j]={3.6004, 4.5995, 2.7993, 0.9991, 0.8011, 2.6013} MHz

Fc[3,j]={4.4002, 3.3998, 1.1997, 1.0004, 3.2005, 4.5995} MHz

Fc[4,j]={4.8001, 2.2001, 0.3999, 2.9999, 4.4002, 1.8002} MHz

Fc[5,j]={4.0003, 1.0004, 1.9995, 4.9994, 2.0008, 0.9991} MHz

Fc[6,j]={1.1997, 3.2005, 3.3994, 2.0008, 3.5991, 0.8011} MHz

Fc[7,j]={0.3990, 4.4002, 0.7998, 4.0003, 1.1997, 3.6004} MHz

Figure 29:
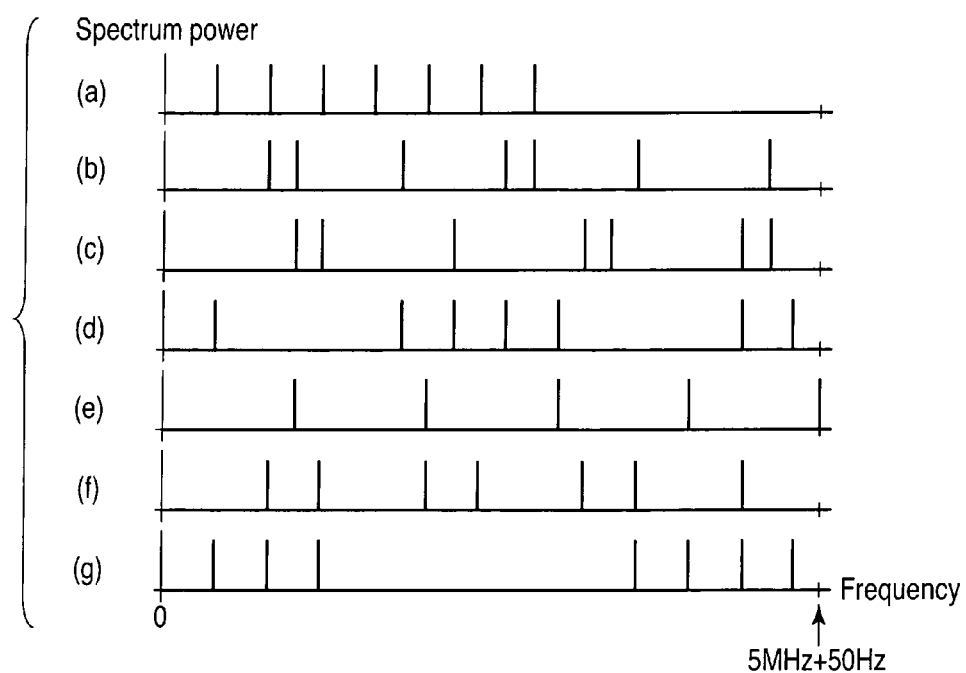
FIG. 29 is a waveform diagram for explaining an operation of the waveform observation system containing the sampling apparatus for the measuring target signal according to the second embodiment of the present invention.

FIG. 29 shows a spectrum diagram of the calculated harmonic beat components.

The fundamental wave beat component frequency output portion 50 which receives the theoretical frequencies Fc[i,j] of these harmonic beat components and the frequencies Fb[i] of the plural peak signals output from the peak signal detecting portion 52, calculates the sum of the absolute values of differences between the theoretical frequency Fc[i,j] of the harmonic beat component and the plural peak signals most proximate to those in terms of the frequency in the form of {1.7989, 2.0008, 2.0008, 0.0, 2.1975, 2.2001, 2.0008} MHz successively and determines that the peak signal of i=4 which gives Fc[i,j] having the smallest error of 0.0 MHz is the fundamental beat component (specific signal) and then, outputs that frequency Fb[4]=2.6 MHz to the repetition frequency calculating portion 28 as the specific signal frequency.

The repetition frequency calculating portion 28 calculates a change amount ΔFh=2.6 MHz−2.7 MHz=−100 MHz of the frequency of the specific signal with respect to a predetermined minute change amount ΔFs=100 MHz of the temporary sampling frequency by subtracting 2.7 MHz stored in advance from the frequency of the specific signal, 2.6 MHz. Then, the accurate repetition frequency Fx of the measuring target signal P is calculated according to the temporary sampling frequency Fs'=10 MHz, specific signal frequency Fh' of the temporary sampling frequency Fs'=2.7 MHz, predetermined change amount ΔFs of the temporary sampling frequency=100 Hz and change amount ΔFh of the specific signal frequency with respect to the predetermined change of the temporary sampling frequency=−100 kHz, in the form of Fx=Fh'−Fs'·ΔFh/ΔFs=2.7 MHz−10 MHz·(−100 kHz)/100 Hz=10.0027 GHz, and set in the arithmetic operation portion 23.

The arithmetic operation portion 23 calculates a frequency Fs corresponding to a cycle Ts having a difference of a predetermined offset delay time ΔT=100 picoseconds, specified by the parameter specifying portion 22, with respect to an integer (N) times the repetition cycle Tx corresponding to an accurate repetition frequency Fx=10.0027 GHz of the measuring target signal P output by the repetition frequency calculating portion 28, that is, an accurate sampling frequency of the measuring target signal P, according to Fs=Fx/(N+Fx·ΔT), to about 10002689.994 Hz (N=1000) and this calculated regular sampling frequency Fs is specified in the signal generating portion 24.

Consequently, instead of the aforementioned temporary sampling frequency Fs', a sampling pulse having the regular sampling frequency Fs is generated from the sampling pulse generating portion 25 and the measuring target signal P is sampled by the optical sampling portion 26.

The measuring object signal P is sampled with a sampling pulse having the regular sampling frequency Fs by the optical sampling portion 26 and a pulse signal Eo output from the optical sampling portion 26 is fetched into and displayed on the digital oscilloscope 60 as described with reference to FIG. 15.

Accordingly, according to the sampling apparatus for the measuring target signal and the waveform observation system according to the second embodiment of the present invention, even if the measuring target signal P is a signal having plural harmonic components having a similar power, an accurate repetition frequency of the measuring target signal P can be detected using the fundamental wave beat component detection method according to the first embodiment of the present invention. As a result, the measuring target signal P can be sampled at a high accuracy and the waveform of the measuring target signal P can be observed at a high accuracy.

(Third Embodiment)

FIG. 9 is a block diagram for explaining the configuration of the waveform observation system according to the third embodiment of the present invention.

The waveform observation system 40 of the third embodiment is configured so that the functions of the sampling apparatus 21 constituting the waveform observation system 20 of the second embodiment and the digital oscilloscope 60 are accommodated and integrated in a common casing.

More specifically, the waveform observation system 40 of this third embodiment includes an A/D converter 43, a data acquisition control portion 44, a waveform data memory 45, a display control portion 46, a display portion 47 and an observation mode specifying portion 48 as well as the respective components of the sampling apparatus 21 of FIG. 4 according to the second embodiment.

The A/D converter 43 carries out A/D conversion processing for a pulse signal Eo output from the optical sampling portion 26 each time a clock signal C (or a fast clock signal synchronous with that clock signal C may be used instead) from the signal generating portion 24 is received, so as to output data Dp of the peak value of the pulse signal Eo obtained by the A/D conversion processing to the data acquisition control portion 44.

The data acquisition control portion 44 repeats an operation of starting writing of the data Dp into the waveform data memory 45 synchronously with the clock signal C from a timing of a rise-up (or fall) of the trigger signal G from the signal generating portion 24 and after the writing of data of a predetermined quantity is ended, standing by for a next trigger signal G to rise up.

In the meantime, the quantity of data written into the waveform data memory 45 corresponds to the number of display points on the time axis displayed on the display portion 47 described later.

The display control portion 46 forms a waveform display portion together with the display portion 47 so as to display a coordinate screen constituted of the time axis and voltage axis on the display portion 47, read out a series of data Dp stored in the waveform data memory 45 and plot them on the coordinate screen for representing a waveform corresponding to the read-out series of the data Dp.

In the meantime, this display control portion 46 executes processing treatment and display processing for the data Dp stored in the waveform data memory 45 corresponding to observation mode specified by the observation mode specifying portion 48.

That is, if the persistence mode is specified, the series of the data Dp stored in the waveform data memory 45 is displayed in the form of a waveform by leaving the incidental image and if the averaging mode is specified, the series of the data Dp stored in the waveform data memory 45 is obtained by a predetermined number of groups and averaging processing for them is carried out. A series of data obtained by that averaging processing is displayed by overlapping them in the form of a waveform.

The operation of the waveform observation system 40 having such a structure is the same as that of the waveform observation system 20 and even if the measuring target signal P is a signal having plural harmonic components having a similar power, an accurate repetition frequency of the measuring target signal P can be detected. Then, a sampling frequency and a trigger frequency, corresponding to the detected accurate repetition frequency of the measuring target signal P are set up. Consequently, even if the fundamental wave frequency of the measuring target signal P is of unknown waveform or a waveform only whose approximate value is known, it can be displayed stably.

In the meantime, if information about the waveform of the measuring object signal P is acquired and displayed discontinuously, the aforementioned cyclic trigger signals G does not need to be generated and the trigger signal G which rises up once corresponding to a manual trigger operation is output.

For the above-described waveform observation systems 20, 40, the present invention can be applied to E/O sampling type which samples an electric signal with optical pulse as well as the O/O sampling type which samples an optical signal with optical pulse.

A waveform observation system of a measuring target signal according to the third embodiment of the present invention basically includes: an input terminal 21a to input a measuring target signal P; a signal generating portion 24 which generates a clock signal C of a specified sampling frequency; a sampling pulse generating portion 25 which generates a sampling pulse synchronous with the clock signal; a sampling portion 26 which samples the measuring target signal P input to the input terminal 21a with the sampling pulse Ps; a spectrum analyzing portion 51 which receives an output signal from the sampling portion 26 and outputs a spectrum of the output signal; a peak signal detecting portion 52 which detects plural peak signals which appear in a band ½ of the specified sampling frequency from the spectrum output from the spectrum analyzing portion 51 so as to obtain the frequency Fb[i] (i=1, 2, 3 . . . ) of the plural peak signals; a theoretical frequency calculating portion 53 which assumes that each of the plural peak signals detected by the peak signal detecting portion 52 is a beat component (fundamental wave beat component) originating from the fundamental wave of the measuring target signal P so as to calculate successively each theoretical frequency Fc[i,j] (i=1, 2, 3, . . . , j=1, 2, 3 . . . ) of a beat component (harmonic beat component) originating from the harmonic component of the measuring target signal P; a fundamental wave beat component frequency output portion 50 which compares each theoretical frequency Fc[i,j] of the harmonic beat component calculated successively for each peak signal by the theoretical frequency calculating portion 53 with the frequency Fb[i] of the plural peak signals obtained by the peak signal detecting portion 52, determines that the peak signal which gives the theoretical frequency Fc[k,j] (k is an integer) of the harmonic beat component which mostly agrees with those frequencies Fb[i] is the fundamental beat component originating from the fundamental wave of the measuring target signal P based on a result of the comparison, and outputs the frequency Fb[k] of the peak signal as a specific signal frequency Fh'; a repetition frequency calculating portion 28 which specifies a temporary sampling frequency Fs' to the signal generating portion 24, changes the temporary sampling frequency by a predetermined amount ΔFs so as to obtain a change amount ΔFh of the specific signal frequency with respect to the change amount of the sampling frequency and calculates the repetition frequency Fx of the waveform of the measuring target signal P based on the temporary sampling frequency, the specific signal frequency to the temporary sampling frequency, the change amount of the sampling frequency and the change amount of the specific signal frequency; an arithmetic operation portion 23 which calculates a frequency corresponding to a cycle Ts having a difference of a predetermined offset delay time ΔT with respect to an integer time the repetition cycle Tx corresponding to the repetition frequency of the waveform of the measuring target signal P calculated by the repetition frequency calculating portion 28 as a regular sampling frequency Fs to the measuring target signal P and specifies the regular sampling frequency to the signal generating portion; an analog/digital (A/D) converter 43 which converts a signal output from the sampling portion 26 by being sampled with the regular sampling pulse to digital waveform data and outputs it; a waveform data memory 45 to memorize the digital waveform data output from the A/D converter 43; a data acquisition control portion 44 which writes the waveform data output from the A/D converter 43 into the waveform data memory 45 synchronously with the clock signal from the signal generating portion 24; and a display control portion 46 which reads out a series of the waveform data stored in the waveform data memory 45 and causes to display it on the time axis of the display portion 47 at an interval corresponding to the offset delay time ΔT.

In the theoretical frequency calculating portion 53, the theoretical frequency Fc[i,j] of a harmonic beat component originating from a j-order harmonic component of the measuring target signal P in the case where it is assumed that the aforementioned Fb[i] is the frequency of the fundamental wave beat component is calculated based on the following equations:

$$Fc[i,j]=\mod(j \cdot Fb[i], Fs') \ldots$$
in case of $\mod(j \cdot Fb[i], Fs') < Fs'/2$ $$Fc[i,j]=Fs'-\mod(j \cdot Fb[i], Fs') \ldots$$
in case of $\mod(j \cdot Fb[i], Fs') \geq Fs'/2$ In the fundamental wave beat component frequency output portion 50, as shown in (a) of FIG. 3, the sum of absolute values of a difference between each theoretical frequency Fc[i,j] of the harmonic beat component and the plural peak signals most proximate to those in terms of the frequency is calculated successively (steps S19, S20). The peak signal which gives the theoretical frequency Fc[k,j] (k is an integer) of the harmonic beat component which minimizes the sum of the absolute values is determined to be the fundamental wave beat component (specific signal) and the frequency Fb[k] of that peak signal is output as the specific signal frequency Fh' (step S21).

In the fundamental wave beat component frequency output portion 50, as shown in (b) of FIG. 3, by calculating an absolute value of a difference between each theoretical frequency Fc[i,j] of the harmonic beat component and the plural peak signals most proximate to those in terms of the frequency successively (steps S22, S23) and taking out a specified number in an ascending order in a value from the absolute values calculated successively for each peak signal in the steps S22, S23 so as to calculate their sums successively (steps S24, S25), it is permissible to determine that the peak signal which gives each theoretical frequency Fc[k,j] (k is an integer) of the harmonic beat component which minimizes the sum of the absolute values of specified number calculated successively in the steps S24, S25 is the fundamental wave beat component (specific signal) and output the frequency Fb[k] of that peak signal as the specific signal frequency Fh' (step S26).

In the waveform observation system 40 for the measuring object signal according to the third embodiment of the present invention, even if the measuring target signal P has plural harmonic components having a similar power, an accurate repetition frequency of the measuring target signal P can be detected using the fundamental wave beat component detecting method of the first embodiment like the sampling apparatus for the measuring target signal and the waveform observation system 20 of the second embodiment. Consequently, the measuring target signal P can be sampled at a high accuracy and the waveform of the measuring target signal P can be observed at a high accuracy.

Therefore, according to the present invention, as described in detail above, even if the measuring target signal has plural harmonic components having a similar power, stable waveform information about the measuring target signal can be acquired and observed using the fundamental wave beat component detection method which can determine which order frequency component of the measuring target signal each of the plural beat components obtained by sampling the measuring target signal originates from and further, a sampling apparatus and waveform observation system which can constitute the entire system simply can be provided.

The invention claimed is:

1. A fundamental wave beat component detecting method comprising:
   a first stage of analyzing a signal obtained by a sampling apparatus which samples a measuring target signal P with a sampling frequency fs so as to obtain a spectrum of the signal;
   a second stage of detecting plural peak signals which appear in a band ½ of the sampling frequency fs from the spectrum obtained in the first stage and obtaining each frequency fb[i] of the plural peak signals, wherein i is an integer;
   a third stage of successively assuming that each of the plural peak signals detected in the second stage is a fundamental wave beat component originating from a fundamental wave of the measuring target signal P and calculating each theoretical frequency fc[i,j] of a harmonic beat component originating from a harmonic component of the measuring target signal P, wherein i is an integer and j is an integer; and
   a fourth stage of comparing each theoretical frequency fc[i,j] of the harmonic beat component calculated successively for each of the plural peak signals in the third stage with said each frequency fb[i] of the plural peak signals detected in the second stage and based on a result of the comparison, determining one of the plural peak signals whose each theoretical frequency fc[k,j] of the harmonic beat component most closely matches with said each frequency fb[i] of the plural peak signals, as an actual fundamental wave beat component, wherein k is an integer.

2. The fundamental wave beat component detecting method according to claim 1, wherein the third stage includes, in the case where said each frequency fb[i] is successively assumed to be a frequency of the fundamental wave beat component, calculating said each theoretical frequency fc[i,j] of the harmonic beat component originating from the harmonic component of the measuring target signal P according to the following equations:

$fc[i,j]=\mod(j \cdot fb[i], fs)$ in case of $\mod(j \cdot fb[i], fs) < fs/2$, $fc[i,j]=fs-\mod(j \cdot fb[i], fs)$ in case of $\mod(j \cdot fb[i], fs) \geq fs/2$.

3. The fundamental wave beat component detecting method according to claim 2, wherein the fourth stage includes:
   a fifth stage of successively calculating a sum of absolute values of differences in terms of frequency between said each theoretical frequency fc[i,j] of the harmonic beat component and one of the plural peak signals most proximate to said each theoretical frequency fc[i,j]; and
   a sixth stage of determining said one of the plural peak signals whose said each theoretical frequency fc[k,j] of the harmonic beat component minimizes the sum of absolute values calculated successively for each of the plural peak signals in the fifth stage, is the actual fundamental wave beat component originating from the fundamental wave of the measuring target signal P.

4. The fundamental wave beat component detecting method according to claim 2, wherein the fourth stage includes:
   a seventh stage of successively calculating absolute values of differences in terms of frequency between said each theoretical frequency fc[i,j] of the harmonic beat component and one of the plural peak signals most proximate to said each theoretical frequency fc[i,j];
   an eighth stage of successively taking out a specified number of the absolute values in an ascending order of a value from the absolute values calculated for each of the plural peak signals in the seventh stage, and calculating a sum of the taken out absolute values; and
   a ninth stage of determining that said one of the plural peak signals whose said each theoretical frequency fc[k,j] of the harmonic beat component minimizes the sum of the absolute values of the specified number calculated successively for each of the plural peak signals in the eighth stage, is the actual fundamental wave beat component originating from the fundamental wave of the measuring target signal P.

5. A sampling apparatus for a measuring target signal, comprising:
   an input terminal to input a measuring target signal;
   a signal generating portion which generates a clock signal of a specified sampling frequency;

a sampling pulse generating portion which generates a sampling pulse synchronous with the clock signal;

a sampling portion which samples the measuring target signal input to the input terminal with the sampling pulse;

a spectrum analyzing portion which receives an output signal from the sampling portion and outputs a spectrum of the output signal;

a peak signal detecting portion which detects plural peak signals which appear in a band ½ of the specified sampling frequency from the spectrum output from the spectrum analyzing portion so as to obtain each frequency Fb[i] of the plural peak signals, wherein i is an integer;

a theoretical frequency calculating portion which successively assumes that each of the plural peak signals detected by the peak signal detecting portion is a fundamental wave beat component originating from a fundamental wave of the measuring target signal so as to calculate each theoretical frequency Fc[i,j] of a harmonic beat component originating from a harmonic component of the measuring target signal, wherein i is an integer, and j is an integer;

a fundamental wave beat component frequency output portion which: (i) compares each theoretical frequency Fc[i,j] of the harmonic beat component calculated successively for each of the plural peak signals by the theoretical frequency calculating portion with said each frequency Fb[i] of the plural peak signals obtained by the peak signal detecting portion, (ii) determines one of the plural peak signals whose each theoretical frequency Fc[k,j] of the harmonic beat component most closely matches with said each frequency Fb[i] of the plural peak signals, as a fundamental wave beat component originating from the fundamental wave of the measuring target signal based on a result of the comparison, wherein k is an integer, and (iii) outputs the frequency Fb[k] of said one of the plural peak signals as a specific signal frequency Fh';

a repetition frequency calculating portion which:

(i) specifies a temporary sampling frequency Fs' to the signal generating portion, wherein the temporary sampling frequency Fs' has been changed by a predetermined amount so as to obtain a change amount of the specific signal frequency with respect to the change amount of the temporary sampling frequency, and (ii) calculates a repetition frequency of a waveform of the measuring target signal based on the temporary sampling frequency, the specific signal frequency, the change amount of the temporary sampling frequency, and the change amount of the specific signal frequency;

an arithmetic operation portion which calculates a frequency corresponding to a cycle having a difference of a predetermined offset delay time with respect to an integral multiple of a repetition cycle corresponding to the repetition frequency of the waveform of the measuring target signal calculated by the repetition frequency calculating portion as a regular sampling frequency to the measuring target signal and specifies the regular sampling frequency to the signal generating portion;

a clock output terminal to output the clock signal from the signal generating portion outward; and a sampling signal output terminal to output a signal output from the sampling portion outward.

6. The sampling apparatus for the measuring target signal according to claim 5, wherein in a case where said each frequency Fb[i] is successively assumed to be a frequency of the fundamental wave beat component, the theoretical frequency calculating portion calculates said each theoretical frequency Fc[i,j] of the harmonic beat component originating from the harmonic component of the measuring target signal according to following equations:

$$Fc[i,j]=\mod(j\cdot Fb[i], Fs'),$$
in case of $\mod(j\cdot Fb[i], Fs')<Fs'/2$ $$Fc[i,j]=Fs'-\mod(j\cdot Fb[i], Fs'),$$
in case of $\mod(j\cdot Fb[i], Fs')\geq Fs'/2.$ 7. The sampling apparatus for the measuring target signal according to claim 6, wherein the fundamental wave beat component frequency output portion:

successively calculates a sum of absolute values of differences in terms of frequency between said each theoretical frequency Fc[i,j] of the harmonic beat component and one of the plural peak signals most proximate to said each theoretical frequency Fc[i,j], and determines that said one of the plural peak signals whose said each theoretical frequency Fc[k,j] of the harmonic beat component minimizes the sum of absolute values calculated successively for each of the plural peak signals is the fundamental wave beat component originating from the fundamental wave of the measuring target signal, and outputs the frequency Fb[k] of said one of the plural peak signals as the specific signal frequency Fh'.

8. The sampling apparatus for the measuring target signal according to claim 6, wherein the fundamental wave beat component frequency output portion:

successively calculates absolute values of differences in terms of frequency between said each theoretical frequency Fc[i,j] of the harmonic beat component and one of the plural peak signals most proximate to said each theoretical frequency Fc[i,j], successively takes out a specified number of the absolute values calculated for each of the plural peak signals in an ascending order of a value so as to calculate a sum of the taken out absolute values, and determines that said one of the plural peak signals whose said each theoretical frequency Fc[k,j] of the harmonic beat component minimizes the sum of the absolute values of the specified number successively calculated for each of the plural peak signals is the fundamental wave beat component originating from the fundamental wave of the measuring target signal so as to output the frequency Fb[k] of said one of the plural peak signals as the specific signal frequency Fh'.

9. A waveform observation system comprising:

an input terminal to input a measuring target signal;

a signal generating portion which generates a clock signal of a specified sampling frequency;

a sampling pulse generating portion which generates a sampling pulse synchronous with the clock signal;

a sampling portion which samples the measuring target signal input to the input terminal with the sampling pulse;

a spectrum analyzing portion which receives an output signal from the sampling portion and outputs a spectrum of the output signal;

a peak signal detecting portion which detects plural peak signals which appear in a band ½ of the specified sampling frequency from the spectrum output from the spectrum analyzing portion so as to obtain each frequency Fb[i] of the plural peak signals, wherein i is an integer;

a theoretical frequency calculating portion which successively assumes that each of the plural peak signals detected by the peak signal detecting portion is a fundamental wave beat component originating from a fundamental wave of the measuring target signal so as to calculate each theoretical frequency Fc[i,j] of a harmonic beat component originating from a harmonic component of the measuring target signal, wherein i is an integer, and j is an integer;

a fundamental wave beat component frequency output portion which: (i) compares each theoretical frequency Fc[i,j] of the harmonic beat component calculated successively for each of the plural peak signals by the theoretical frequency calculating portion with said each frequency Fb[i] of the plural peak signals obtained by the peak signal detecting portion, (ii) determines one of the plural peak signals whose each theoretical frequency Fc[k,j] of the harmonic beat component most closely matches with said each frequency Fb[i] of the plural peak signals, as a fundamental wave beat component originating from the fundamental wave of the measuring target signal based on a result of the comparison, wherein k is an integer, and (iii) outputs the frequency Fb[k] of said one of the plural peak signals as a specific signal frequency Fh';

a repetition frequency calculating portion which:
(i) specifies a temporary sampling frequency Fs' to the signal generating portion, wherein the temporary sampling frequency has been changed by a predetermined amount so as to obtain a change amount of the specific signal frequency with respect to the change amount of the temporary sampling frequency, and
(ii) calculates a repetition frequency Fx of a waveform of the measuring target signal based on the temporary sampling frequency, the specific signal frequency, the change amount of the temporary sampling frequency, and the change amount of the specific signal frequency;

an arithmetic operation portion which calculates a frequency corresponding to a cycle having a difference of a predetermined offset delay time with respect to an integral multiple of a repetition cycle corresponding to the repetition frequency of the waveform of the measuring target signal calculated by the repetition frequency calculating portion as a regular sampling frequency to the measuring target signal and specifies the regular sampling frequency to the signal generating portion;

an analog/digital converter which converts a signal output from the sampling portion by being sampled with a regular sampling pulse to digital waveform data and outputs the digital waveform data;

a waveform data memory which memorizes the digital waveform data output from the A/D converter;

a data acquisition control portion which writes the digital waveform data output from the A/D converter into the waveform data memory synchronously with the clock signal from the signal generating portion; and a display control portion which reads out a series of the waveform data stored in the waveform data memory and displays the read out data on a time axis of a display portion at an interval corresponding to the predetermined offset delay time.

10. The waveform observation system according to claim 9, wherein in a case where said each frequency Fb[i] is successively assumed to be a frequency of the fundamental wave beat component, the theoretical frequency calculating portion calculates said each theoretical frequency Fc[i,j] of the harmonic beat component originating from the harmonic component of the measuring target signal according to following equations:

$Fc[i,j] = \mathrm{mod}(j \cdot Fb[i], Fs')$,
in case of $\mathrm{mod}(j \cdot Fb[i], Fs') < Fs'/2$ $Fc[i,j] = Fs' - \mathrm{mod}(j \cdot Fb[i], Fs')$,
in case of $\mathrm{mod}(j \cdot Fb[i], Fs') \geq Fs'/2$.

11. The waveform observation system according to claim 10, wherein the fundamental wave beat component frequency output portion:

successively calculates a sum of absolute values of differences in terms of frequency between said each theoretical frequency Fc[i,j] of the harmonic beat component and one of the plural peak signals most proximate to said each theoretical frequency Fc[i,j], and determines that said one of the plural peak signals whose said each theoretical frequency Fc[k,j] of the harmonic beat component minimizes the sum of absolute values calculated successively for each of the plural peak signals is the fundamental wave beat component originating from the fundamental wave of the measuring target signal, and outputs the frequency Fb[k] of said one of the plural peak signals as the specific signal frequency Fh'.

12. The waveform observation system according to claim 10, wherein the fundamental wave beat component frequency output portion:

successively calculates absolute values of differences in terms of frequency between said each theoretical frequency Fc[i,j] of the harmonic beat component and one of the plural peak signals most proximate to said each theoretical frequency Fc[i,j], successively takes out a specified number of the absolute values calculated for each of the plural peak signals in an ascending order of a value so as to calculate a sum of the taken out absolute values, and determines that said one of the peak signals whose said each theoretical frequency Fc[k,j] of the harmonic beat component minimizes the sum of the absolute values of the specified number successively calculated for each of the plural peak signals is the fundamental wave beat component originating from the fundamental wave of the measuring target signal so as to output the frequency Fb[k] of said one of the plural peak signals as the specific signal frequency Fh'.

* * * * *